United States Patent
Abdalla

(10) Patent No.: US 10,688,947 B2
(45) Date of Patent: Jun. 23, 2020

(54) POWER DISTRIBUTION MODULE FOR USE IN A VEHICLE

(71) Applicant: Motor Coach Industries Limited, Winnipeg (CA)

(72) Inventor: Ibrahem Abdalla, Elgin, IL (US)

(73) Assignee: Motor Coach Industries Limited, Winnipeg (CA)

( * ) Notice: Subject to any disclaimer, the term of this patent is extended or adjusted under 35 U.S.C. 154(b) by 0 days.

(21) Appl. No.: 16/105,517

(22) Filed: Aug. 20, 2018

(65) Prior Publication Data

US 2019/0193655 A1 Jun. 27, 2019

Related U.S. Application Data

(63) Continuation of application No. 15/434,997, filed on Feb. 16, 2017, now Pat. No. 10,071,698.

(51) Int. Cl.
| | | |
|---|---|---|
| *B60R 16/02* | (2006.01) | |
| *H01R 12/57* | (2011.01) | |
| *H05K 7/14* | (2006.01) | |
| *B60R 16/023* | (2006.01) | |
| *H02B 1/20* | (2006.01) | |
| *H02B 1/04* | (2006.01) | |

(Continued)

(52) U.S. Cl.
CPC .......... *B60R 16/0239* (2013.01); *B60R 16/03* (2013.01); *H01R 12/57* (2013.01); *H02B 1/04* (2013.01); *H02B 1/20* (2013.01); *H05K 7/1432* (2013.01); *H01R 2201/26* (2013.01); *H02G 3/083* (2013.01)

(58) Field of Classification Search
CPC ..... B60R 16/0315; B60R 25/04; B60R 16/02; B60R 25/1003; B60R 25/20; B60R 16/03; B60R 11/0235; B60R 2011/0017; B60R 16/0239; H02B 1/04; H02B 1/20; H01R 12/57; H01R 2201/26
See application file for complete search history.

(56) References Cited

U.S. PATENT DOCUMENTS

| | | | |
|---|---|---|---|
| D305,531 S | 1/1990 | Suzuki et al. | |
| 5,504,655 A | * 4/1996 | Underwood | ............. B60L 3/00 |
| | | | 200/50.1 |

(Continued)

FOREIGN PATENT DOCUMENTS

| | | |
|---|---|---|
| CN | 204077385 U | 1/2015 |
| DE | 19944833 A1 | 3/2001 |

(Continued)

OTHER PUBLICATIONS

Jun. 13, 2018—(WO) International Search Report and Written Opinion—APP. PCT/US2018/00083.

(Continued)

*Primary Examiner* — Adam B Dravininkas
(74) *Attorney, Agent, or Firm* — Banner & Witcoff, Ltd.

(57) ABSTRACT

A vehicle power distribution module may include a panel having a plurality of input terminals, a first plurality of output terminals, and a second plurality of output terminals. The first plurality of input terminals may be connected to a first power supply having a first voltage and to a second power supply having a second voltage and wherein the first voltage may be different than the second voltage.

20 Claims, 14 Drawing Sheets

(51) Int. Cl.
  *B60R 16/03*   (2006.01)
  *H02G 3/08*   (2006.01)

(56) References Cited

U.S. PATENT DOCUMENTS

| | | | | |
|---|---|---|---|---|
| 5,587,890 | A * | 12/1996 | Happ | B60R 16/0238 |
| | | | | 174/260 |
| 5,643,693 | A * | 7/1997 | Hill | H01M 2/1083 |
| | | | | 429/121 |
| 5,764,487 | A * | 6/1998 | Natsume | B60R 16/0238 |
| | | | | 174/72 B |
| 5,949,148 | A * | 9/1999 | Wagner | B60R 16/0238 |
| | | | | 307/10.1 |
| 6,015,302 | A * | 1/2000 | Butts | B60R 16/0238 |
| | | | | 439/76.2 |
| D427,151 | S | 6/2000 | Byrd et al. | |
| 6,350,949 | B1 * | 2/2002 | Boyd | B60R 16/0238 |
| | | | | 174/17.05 |
| 6,404,607 | B1 * | 6/2002 | Burgess | B60R 16/0315 |
| | | | | 361/58 |
| 6,541,700 | B2 | 4/2003 | Chiriku et al. | |
| 6,600,236 | B2 * | 7/2003 | Rhodes | B60R 16/0207 |
| | | | | 116/200 |
| 6,700,795 | B1 | 3/2004 | Jones et al. | |
| 6,856,045 | B1 * | 2/2005 | Beneditz | G06F 1/263 |
| | | | | 307/10.1 |
| 7,072,188 | B2 * | 7/2006 | Janisch | B60R 16/0239 |
| | | | | 174/520 |
| 7,132,761 | B2 | 11/2006 | Rhodes | |
| 7,338,331 | B2 * | 3/2008 | Yoon | H01R 9/2475 |
| | | | | 439/709 |
| 7,342,325 | B2 | 3/2008 | Rhodes | |
| 7,354,280 | B2 * | 4/2008 | Gordon | B60R 16/0315 |
| | | | | 439/638 |
| 7,375,981 | B2 * | 5/2008 | Dickson | B60R 16/0238 |
| | | | | 361/627 |
| 7,396,262 | B2 * | 7/2008 | Korczynski | B60R 16/0238 |
| | | | | 174/138 F |
| 7,955,133 | B2 | 6/2011 | Scheele et al. | |
| 7,983,050 | B2 * | 7/2011 | Gaynier | B60R 16/0239 |
| | | | | 361/728 |
| 9,221,409 | B1 * | 12/2015 | Gauthier | B60R 16/03 |
| 9,227,581 | B1 | 1/2016 | Gauthier et al. | |
| 9,265,164 | B2 | 2/2016 | Darr et al. | |
| 9,440,600 | B2 * | 9/2016 | Koch | B60L 3/0046 |
| 9,720,044 | B2 * | 8/2017 | Mills | H01H 71/04 |
| 10,071,698 | B2 | 9/2018 | Abdalla | |
| 2002/0061666 | A1 | 5/2002 | Sato | H01R 9/226 |
| | | | | 439/76.2 |
| 2004/0048142 | A1 * | 3/2004 | Marusak | B60R 16/0238 |
| | | | | 429/61 |
| 2005/0113988 | A1 * | 5/2005 | Nasr | A62C 27/00 |
| | | | | 701/22 |
| 2005/0141154 | A1 * | 6/2005 | Consadori | B60R 16/023 |
| | | | | 361/62 |
| 2006/0164797 | A1 * | 7/2006 | Korczynski | H01H 85/205 |
| | | | | 361/626 |
| 2006/0214722 | A1 * | 9/2006 | Hirose | H03K 17/162 |
| | | | | 327/407 |
| 2007/0147017 | A1 * | 6/2007 | Eom | H05K 1/141 |
| | | | | 361/809 |
| 2008/0278890 | A1 * | 11/2008 | Mann | H02B 1/056 |
| | | | | 361/636 |
| 2010/0109430 | A1 * | 5/2010 | DiSaverio | B60R 16/03 |
| | | | | 307/10.1 |
| 2011/0084549 | A1 * | 4/2011 | Scheele | B60R 16/0239 |
| | | | | 307/9.1 |
| 2011/0156743 | A1 * | 6/2011 | Xie | G01R 31/40 |
| | | | | 324/764.01 |
| 2011/0163597 | A1 * | 7/2011 | Lin | B60R 16/03 |
| | | | | 307/9.1 |
| 2012/0194163 | A1 * | 8/2012 | Pagenkopf | B60R 16/02 |
| | | | | 323/311 |
| 2012/0268864 | A1 | 10/2012 | Borowicz et al. | |
| 2012/0326609 | A1 * | 12/2012 | Kumar | H05B 37/0209 |
| | | | | 315/88 |
| 2014/0084879 | A1 * | 3/2014 | Kurokawa | H02M 3/04 |
| | | | | 323/234 |
| 2014/0209742 | A1 * | 7/2014 | Guering | H05K 7/1439 |
| | | | | 244/119 |
| 2014/0211379 | A1 * | 7/2014 | Borowicz | H05K 5/0239 |
| | | | | 361/642 |
| 2015/0031226 | A1 * | 1/2015 | Wisneski | H01R 13/631 |
| | | | | 439/310 |
| 2015/0165992 | A1 * | 6/2015 | Scheele | B60R 16/0239 |
| | | | | 307/9.1 |
| 2015/0311688 | A1 * | 10/2015 | Kakimi | H05K 7/026 |
| | | | | 174/562 |
| 2015/0314740 | A1 * | 11/2015 | Reichow | B60R 16/03 |
| | | | | 701/36 |
| 2016/0073520 | A1 * | 3/2016 | Darr | H05K 7/026 |
| | | | | 361/752 |
| 2016/0345455 | A1 * | 11/2016 | Maebashi | H02G 3/088 |
| 2016/0357237 | A1 * | 12/2016 | Aoki | G06F 1/26 |
| 2017/0327064 | A1 * | 11/2017 | Leverett, Jr. | H05K 5/0043 |

FOREIGN PATENT DOCUMENTS

| | | |
|---|---|---|
| DE | 10208981 A1 | 9/2002 |
| EP | 1178548 A1 | 2/2002 |
| WO | 1998021792 A2 | 5/1998 |
| WO | 2015172857 A1 | 11/2015 |

OTHER PUBLICATIONS

Motor Coach Industries Electrical Board—release date unknown, but prior to the filing date of the present application, Motor Coach Industries, United States.

* cited by examiner

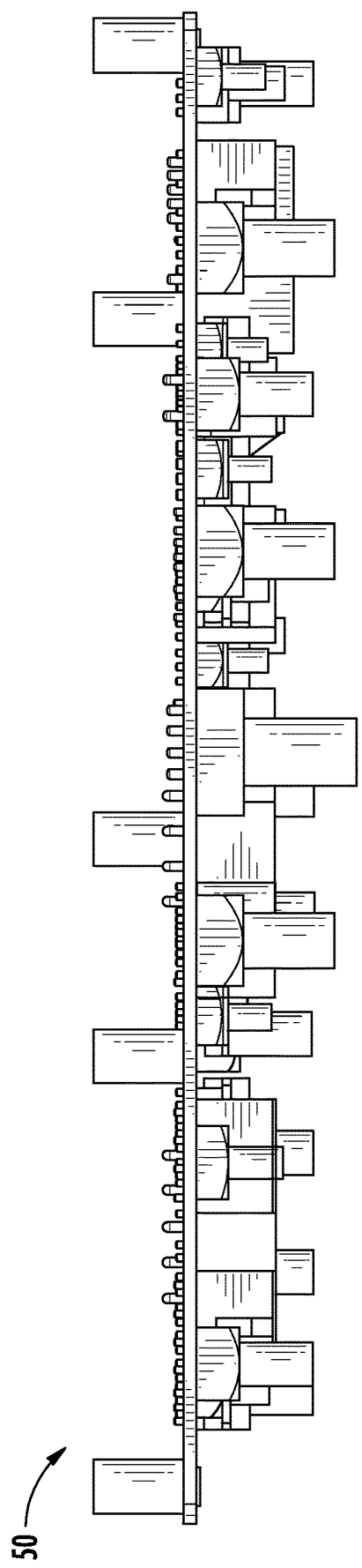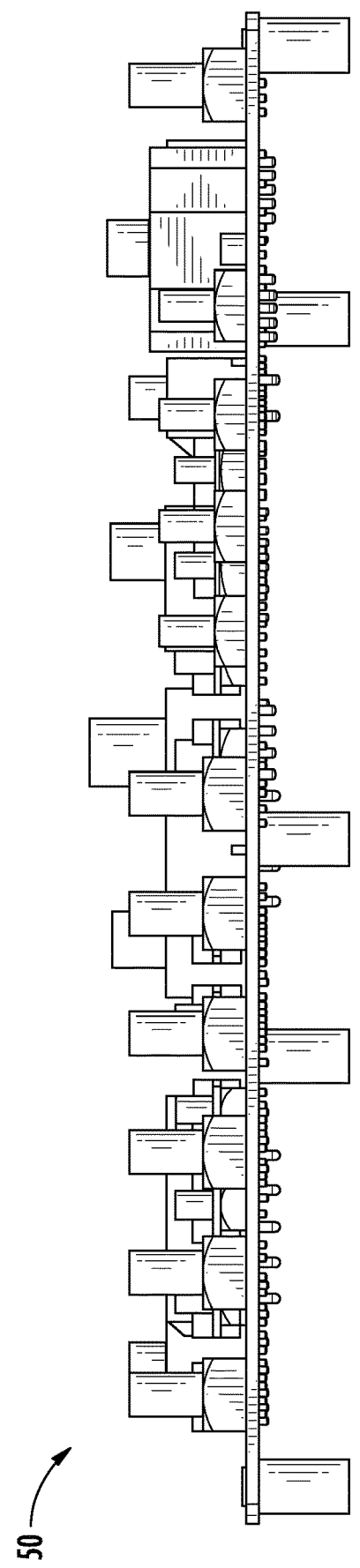
FIG. 1E
FIG. 1F

POWER DISTRIBUTION MODULE FOR USE IN A VEHICLE

CROSS REFERENCE TO RELATED APPLICATIONS

This application is a continuation of U.S. patent application Ser. No. 15/434,997 filed Feb. 16, 2017, the content of which is incorporated in its entirety herein.

TECHNICAL FIELD

The disclosure relates generally to a power distribution system for use in a vehicle and more particularly to a power distribution module or board having multiple power inputs for use in a coach or bus.

BACKGROUND

Power distribution systems are commonly used in vehicles such as coaches or buses to route and control the power throughout the vehicle. These systems include multiple fuses and connectors for distributing power to and protecting various components of the vehicle. Multiple distribution circuits may be used to accommodate the vehicle's power demands. Consequently, there may exist a need for a system or circuit configured to fit in a limited physical space and capable of receiving multiple input voltages, handling multiple current levels at different voltage levels.

BRIEF SUMMARY

The present disclosure is directed to a vehicle power distribution module or circuit board, for use in a vehicle such as a coach or bus. The panel or board may be used to distribute and protect all main power on a coach or bus.

In one example, the disclosure provides a power distribution module for a vehicle. The power distribution module includes a panel having a top side and a bottom side and having a perimeter, the perimeter of the panel comprising a top edge, a bottom edge, a first edge and a second edge, wherein the top edge is positioned opposite of the bottom edge and the first edge is positioned opposite of the second edge; a plurality of input terminals positioned on the panel proximate to the top edge, the plurality of input terminals comprising: a first input terminal adapted for connection to a first power supply, and a second input terminal adapted for connection to a second power supply; a first plurality of output terminals positioned on the panel proximate to the bottom edge, wherein the first plurality of output terminals is connected to the first input terminal; a first plurality of fuses connected between the first input terminal and the first plurality of output terminals, the first plurality of fuses positioned on the panel proximate to the first plurality of output terminals such that the first plurality of output terminals is positioned between the first plurality of fuses and the bottom edge; a second plurality of output terminals positioned on the panel proximate to the bottom, wherein the second plurality of output terminals is connected to the second input terminal; a second plurality of fuses connected between the second input terminal and the second plurality of output terminals, the second plurality of fuses positioned on the panel proximate to the second plurality of output terminals such that the second plurality of output terminals is positioned between the second plurality of fuses and the bottom edge. The voltage of the first power supply may be different than the voltage of the second power supply.

In some examples the voltage of the first power supply may be 24 volts and the voltage of the second power supply may be 12 volts.

In some examples a diameter of the first input terminal may be smaller than a diameter of the second input terminal.

The power distribution module may also include a first equalizer output terminal connected to the first input terminal and a second equalizer output terminal connected to the second input terminal, the first equalizer output terminal and the second equalizer output terminal positioned on the panel proximate to the top edge.

The power distribution module may also include a third plurality of output terminals connected to the first input terminal, and a third plurality of fuses connected between the first input terminal and the third plurality of output terminals. The first plurality of fuses may use a first fuse type, the second plurality of fuses may use a second fuse type, and the third plurality of fuses may use a third fuse type; and the third fuse type is different than the first fuse type and the second fuse type.

The power distribution module may also include a third input terminal, the third input terminal adapted for connection to switched input from the first power supply; a third plurality of output terminals connected to the third input terminal; a third plurality of fuses connected between the third input terminal and the third plurality of output terminals; a fourth input terminal, the fourth input terminal adapted for connection to switched input from the second power supply; a fourth plurality of output terminals connected to the fourth input terminal; and a fourth plurality of fuses connected between the fourth input terminal and the fourth plurality of output terminals. The first input terminal may be adapted for connection to hot input from the first power supply and the second input terminal may be adapted for connection to hot input from the second power supply.

The power distribution module may have a length of the top edge and a length of the bottom edge that are each less than or equal to 11 inches (27.94 centimeters (cm)), and a length of the first edge and a length of the second edge that are each less than or equal to 8.5 inches (21.59 cm). In other examples, the power distribution module may have a length of the top edge and a length of the bottom edge that are each between 10 inches (25.4 cm) and 12 inches (30.48 cm), and wherein a length of the first edge and a length of the second edge that are each between 7 inches (17.78 cm) and 9 inches (22.86 cm).

The panel of the power distribution module may be comprised of multiple layers including a first layer containing all electrical connections between the first input terminal and the first plurality of output terminals; a second layer containing all electrical connections between the second input terminal and the second plurality of output terminals; and a third layer composed substantially of insulating material. The third layer may be positioned between the first layer and the second layer. The power distribution module may be constructed using press fit technology.

In another example, the disclosure provides a power distribution module for a vehicle. The power distribution module includes a plurality of input terminals comprising: a first input terminal adapted for connection to a hot input from a first power supply; a second input terminal adapted for connection to a switched input from the first power supply; a third input terminal adapted for connection to a hot input from a second power supply; and a fourth input terminal adapted for connection to a switched input from the second power supply; a first plurality of output terminals, wherein each output terminal of the first plurality of output terminals is connected to one of the first input terminal, the second input terminal, the third input terminal, or the fourth input terminal; and a first plurality of fuses, wherein a single fuse of the first plurality of fuses is connectable between each output terminal of the first plurality of output terminals and the respective input terminal. The voltage of the first power supply may be different than the voltage of the second power supply.

The power distribution module may also include a second plurality of output terminals, wherein each output terminal of the second plurality of output terminals is connected to one of the first input terminal, the second input terminal, the third input terminal, or the fourth input terminal; and a second plurality of fuses, wherein a single fuse of the second plurality of fuses is connectable between each output terminal of the second plurality of output terminals and the respective input terminal. Each output terminal of the first plurality of output terminals may be a stud; and each output terminal of the second plurality of output terminals may use a connection type other than a stud.

The power distribution module may also include a panel having a top side and a bottom side and having a perimeter, the perimeter of the panel comprising a top edge, a bottom edge, a first edge and a second edge wherein the top edge is positioned opposite of the bottom edge and the first edge is positioned opposite of the second edge. The plurality of input terminals may be positioned on the panel and proximate to the top edge. The first plurality of output terminals may be positioned on the panel and proximate to the bottom edge. The second plurality of output terminals may be positioned on the panel below the plurality of input terminals and above the first plurality of output terminals.

The power distribution module may have a length of the top edge and a length of the bottom edge that are each less than or equal to 11 inches (27.94 cm), and a length of the first edge and a length of the second edge that are each less than or equal to 8.5 inches (21.59 cm).

The power distribution module may have a length of the top edge and a length of the bottom edge each of between 10 inches (25.4 cm) and 12 inches (30.48 cm), and a length of the first edge and a length of the second edge that are each between 7 inches (17.78 cm) and 9 inches (22.86 cm).

The power distribution module may also include a first equalizer output terminal connected to the first input terminal and a second equalizer output terminal connected to the second input terminal and positioned on the panel and proximate to the top edge.

In another example, the disclosure provides a power distribution system for a vehicle. The power distribution system may include a first power supply; a second power supply; a multi-layer panel having a top side and a bottom side and having a perimeter, the perimeter of the panel comprising a top edge, a bottom edge, a first edge and a second edge wherein the top edge is positioned opposite of the bottom edge and the first edge is positioned opposite of the second edge; a plurality of input terminals positioned on the panel and proximate to the top edge, the plurality of input terminals comprising: a first input terminal connected to a hot input from the first power supply; a second input terminal connected to a switched input from the first power supply; a third input terminal connected to a hot input from the second power supply; and a fourth input terminal adapted for connection to a switched input from the second power supply; a first plurality of output terminals positioned on the panel proximate to the bottom edge of the panel, each of the first plurality of output terminals comprising a stud, and each of the first plurality of output terminals connected to one of the first input terminal, the second input terminal, the third input terminal, or the fourth input terminal; a first plurality of fuses wherein a single fuse of the first plurality of fuses is connectable between each output terminal of the first plurality of output terminals and the respective input terminal, and wherein the first plurality of fuses is comprised of individual fuses rated for currents of 50 amps to 80 amps; a second plurality of output terminals positioned on the panel proximate to the first edge of the panel, each of the second plurality of output terminals comprising a stud, and each of the second plurality of output terminals connected to one of the first input terminal, the second input terminal, the third input terminal, or the fourth input terminal; a second plurality of fuses wherein a single fuse of the second plurality of fuses is connectable between each output terminal of the second plurality of output terminals and the respective input terminal, and wherein the second plurality of fuses is comprised of individual fuses rated for currents of 40 amps or less; a third plurality of output terminals positioned on the panel proximate to the first edge of the panel, each of the third plurality of output terminals comprising a stud, and each of the third plurality of output terminals connected to one of the first input terminal, the second input terminal, the third input terminal, or the fourth input terminal; and a third plurality of fuses wherein a single fuse of the third plurality of fuses is connectable between each output terminal of the third plurality of output terminals and the respective input terminal, and wherein the third plurality of fuses is comprised of individual fuses rated for currents of 70 amps or less; a fourth plurality of output terminals positioned on the panel, each of the fourth plurality of output terminals comprising a connection type other than a stud, and each of the fourth plurality of output terminals connected to one of the first input terminal, the second input terminal, the third input terminal, or the fourth input terminal; a fourth plurality of fuses wherein a single fuse of the fourth plurality of fuses is connectable between each output terminal of the fourth plurality of output terminals and the respective input terminal, and wherein the fourth plurality of fuses is comprised of individual fuses rated for currents of 25 amps or less. In various embodiments, the distance between the top edge and the bottom edge may not exceed 8.5 inches (21.59 cm) and the distance between the first edge and the second edge may not exceed 11 inches (27.94 cm). The voltage supplied by the first power supply may be different than the voltage supplied by the second power supply.

The power distribution module may also include a communication module positioned on the multi-layer panel and configured to alert a user if at least one predetermined fuse of one of the first plurality of fuses, the second plurality of fuses, the third plurality of fuses, and the fourth plurality of fuses is blown.

The power distribution system may also include first equalizer output terminal connected to the first input terminal and positioned on the panel and proximate to the top edge; and a second equalizer output terminal connected to the second input terminal and positioned on the panel and proximate to the top edge.

BRIEF DESCRIPTION OF THE DRAWINGS

The accompanying drawings are included to provide a further understanding of the claims, are incorporated in, and constitute a part of this specification. The detailed description and illustrated embodiments described serve to explain the principles defined by the claims.

FIG. 1E illustrates a top side view of the panel of FIG. 1B.

FIG. 1F illustrates a bottom side view of the panel of FIG. 1B.

DETAILED DESCRIPTION

Figure 1A:
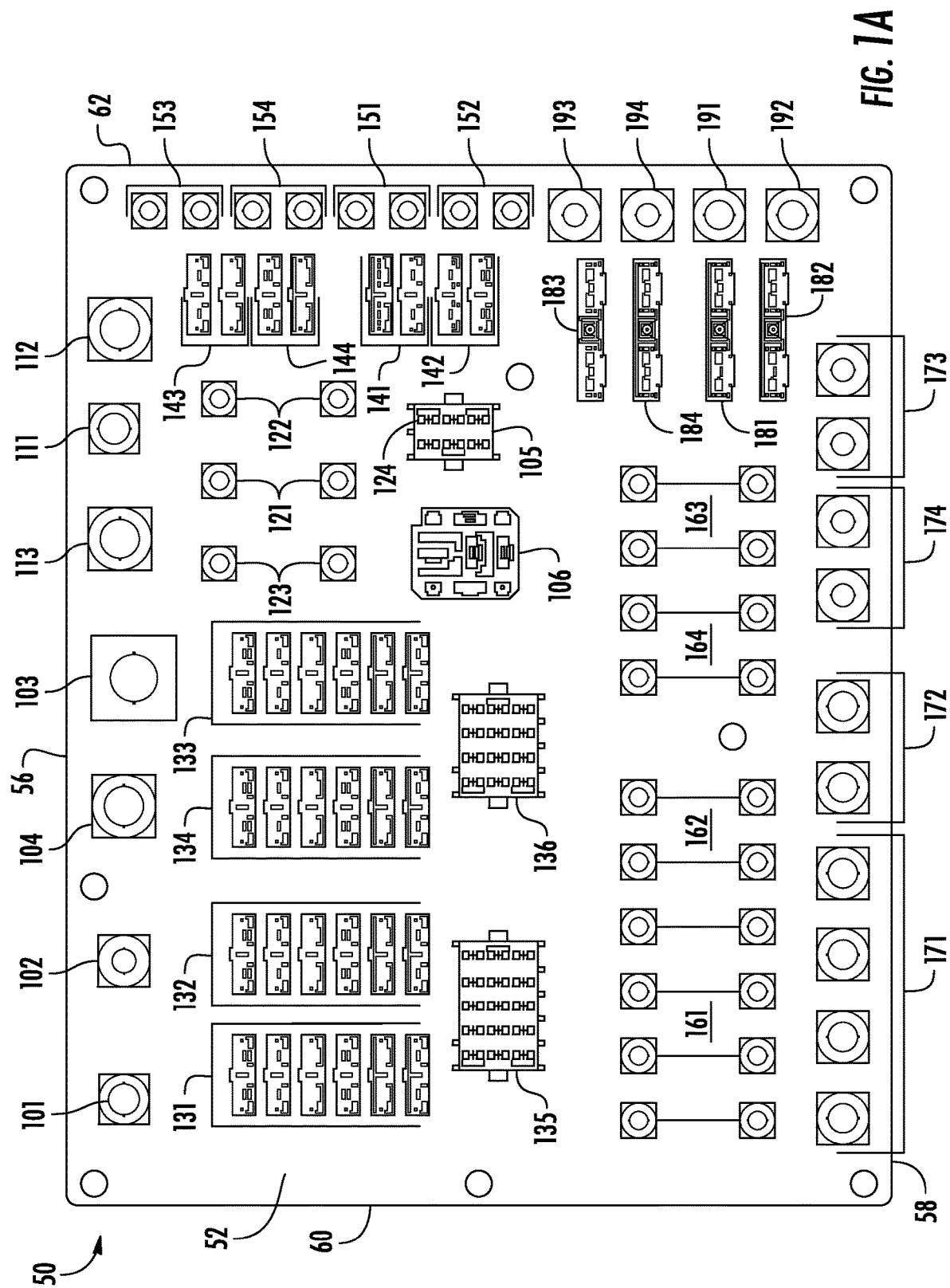
FIG. 1A illustrates a top view of an exemplary power distribution module or panel according to aspects of this disclosure.
Figure 1B:
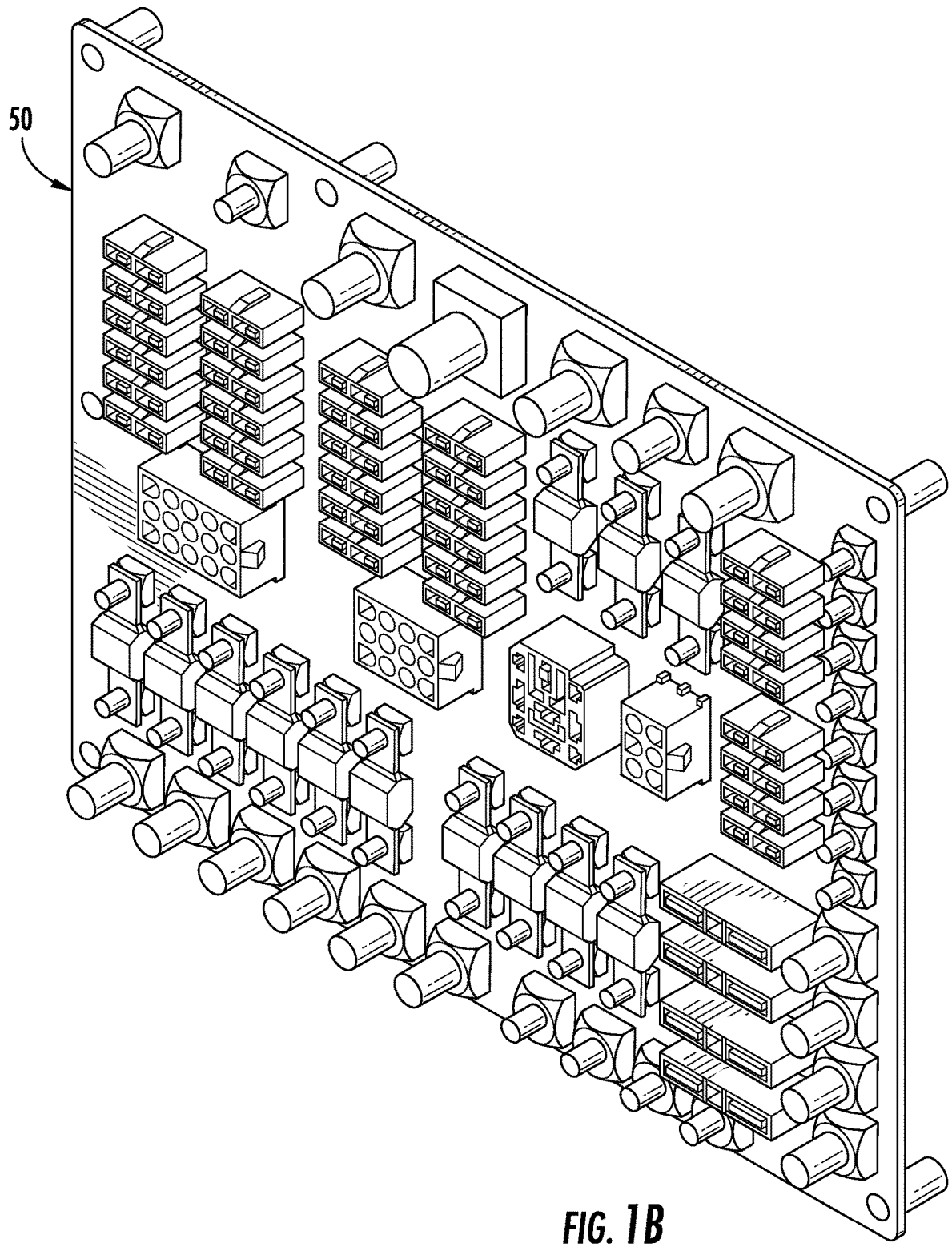
FIG. 1B illustrates a perspective view of an exemplary power distribution module or panel according to aspects of this disclosure.
Figure 1C:
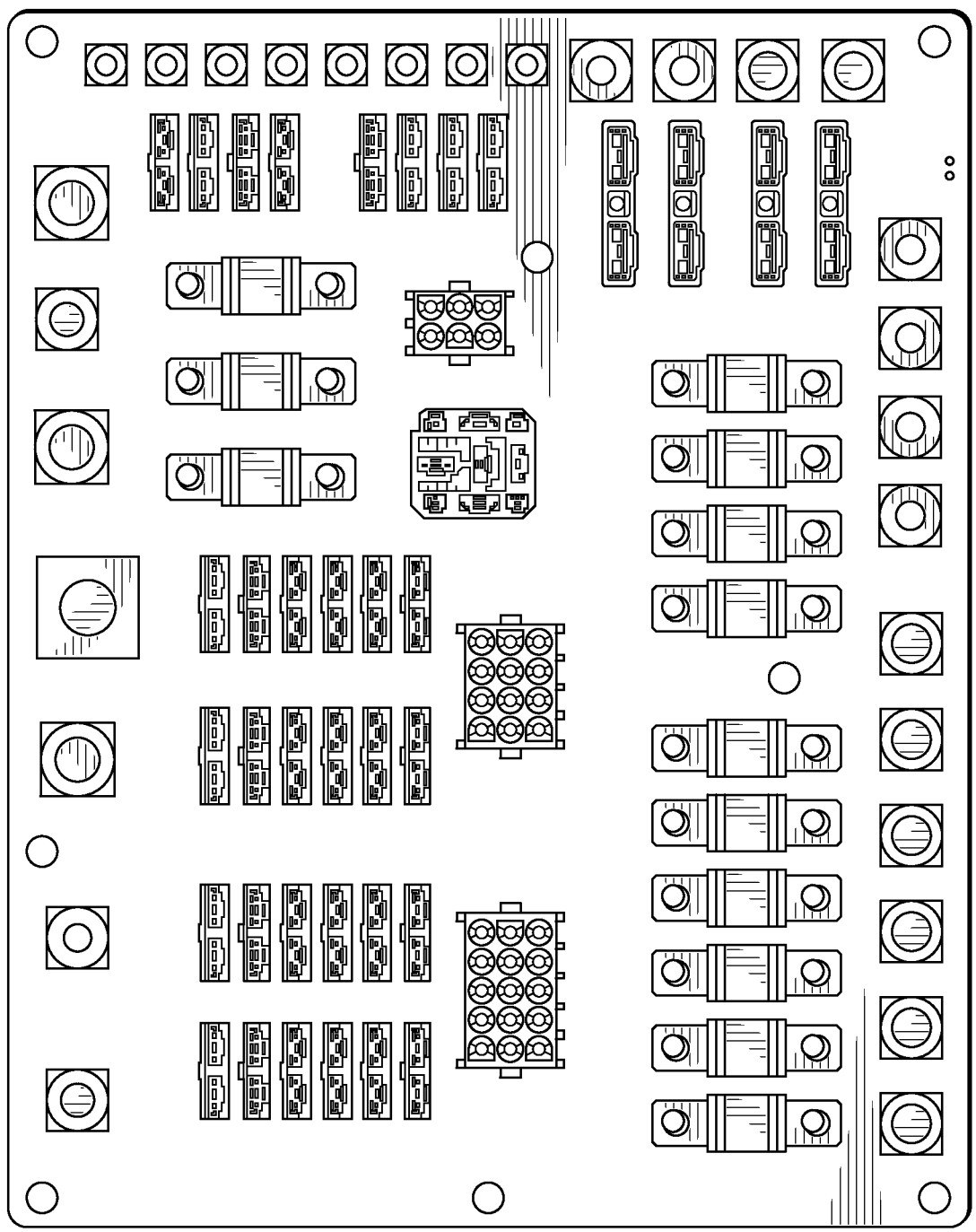
FIG. 1C illustrates a top view of the panel of FIG. 1B.
Figure 1D:
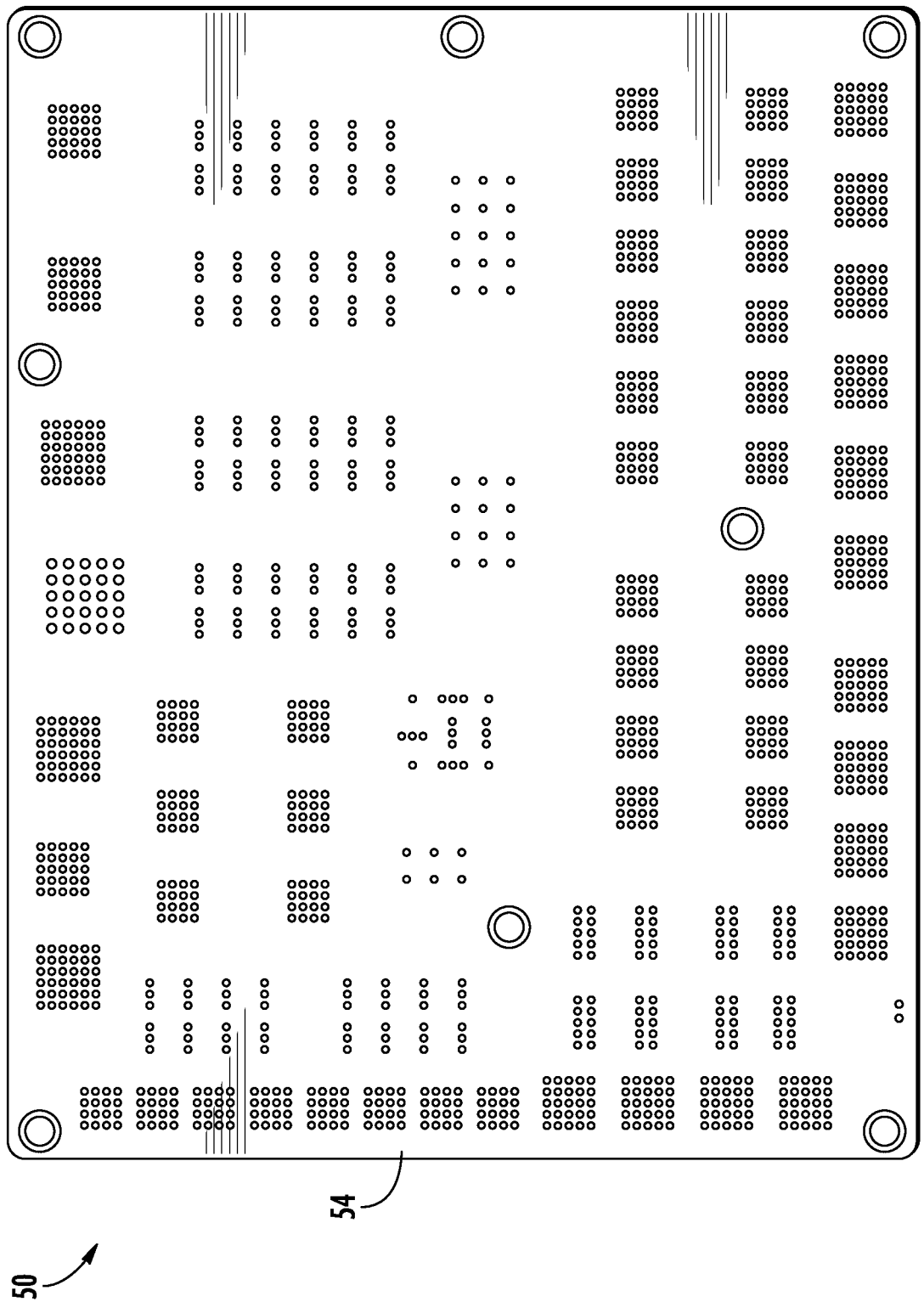
FIG. 1D illustrates a back view of the panel of FIG. 1B.
Figure 1G:
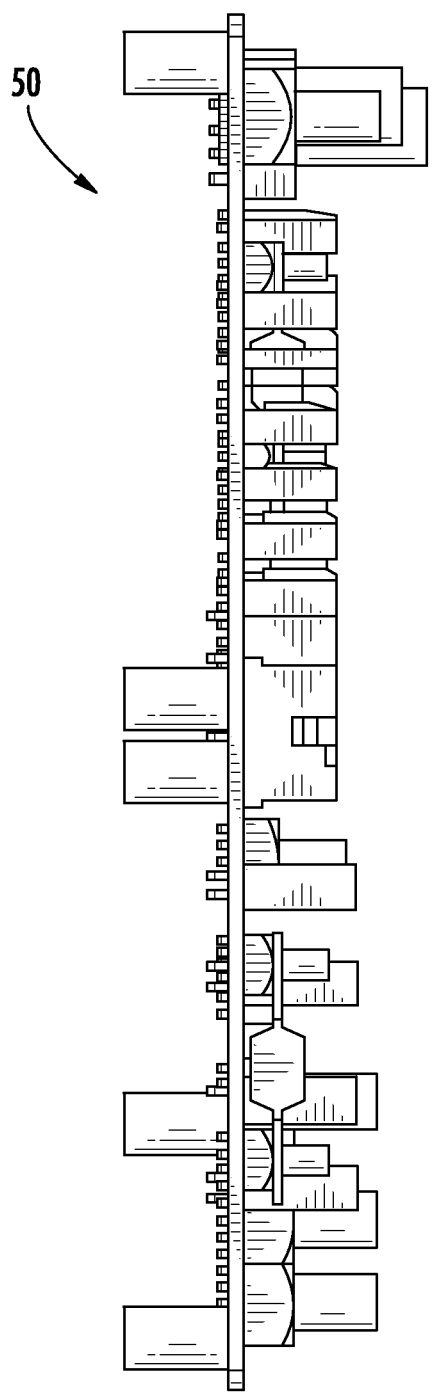
FIG. 1G illustrates a left side view of the panel of FIG. 1B.
Figure 1H:
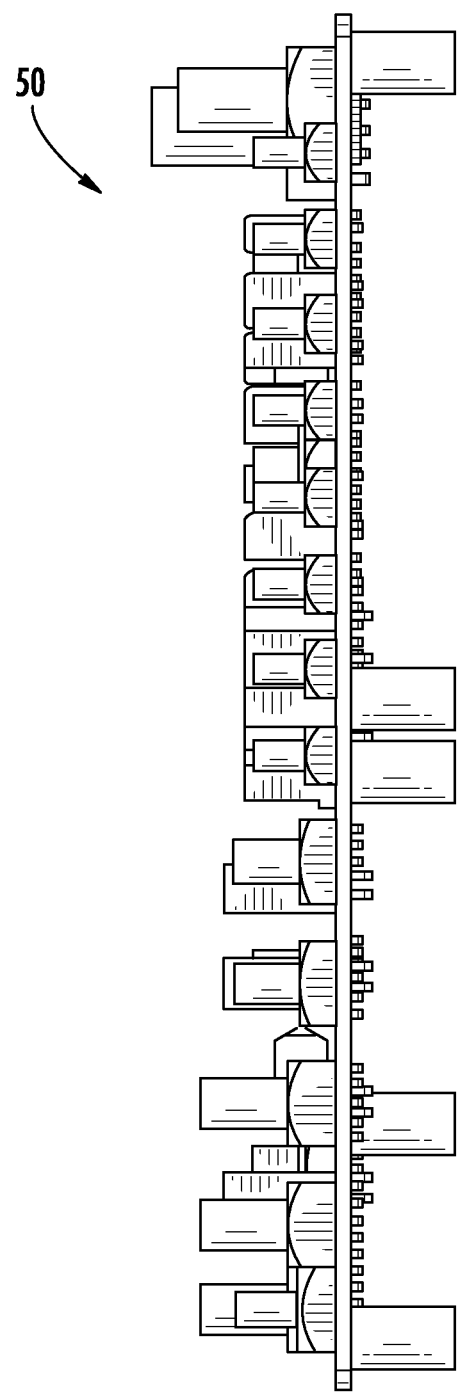
FIG. 1H illustrates a right side view of the panel of FIG. 1B.

In the following description of the various embodiments, reference is made to the accompanying drawings, which form a part hereof, and in which is shown by way of illustration various embodiments in which aspects described herein may be practiced. It is to be understood that other embodiments may be utilized and structural and functional modifications may be made without departing from the scope of the described aspects and embodiments. Aspects described herein are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. The use of the terms "mounted," "connected," "coupled," "positioned," "engaged" and similar terms, is meant to include both direct and indirect mounting, connecting, coupling, positioning and engaging.

Also, while the terms "top," "bottom," "front," "back," "side," "rear," and the like may be used in this specification to describe various example features and elements of the disclosure, these terms are used herein as a matter of convenience, e.g., based on the example orientations shown in the figures or the orientation during typical use. Nothing in this specification should be construed as requiring a specific three dimensional orientation of structures in order to fall within the scope of this disclosure. The reader is advised that the attached drawings are not necessarily drawn to scale.

"Plurality," as used herein, indicates any number greater than one, either disjunctively or conjunctively, as necessary, up to an infinite number.

The present disclosure is directed to a power distribution module panel or circuit board for use in a vehicle such as a coach or bus. As will be discussed in greater detail below, in some embodiments, the distribution module may be used to distribute and protect all the main power on a coach or bus. The power distribution module may include multiple power inputs and power outputs. The board includes multiple different locations to engage different types/models of fuses. These fuse locations are connected through the board between the inputs and respective outlets. The power distribution module may include inputs for power at multiple different voltages (for example, 12V and 24V power inputs). The power distribution module may include inputs for switched power, which includes a disconnect between the power source and the board, and hot power, which does not include a disconnect between the power source and the board. In some embodiments, the power distribution module may also include a control module and/or a communications module and may provide the ability to monitor key fuses to provide warning to the driver based on J1939 communication protocol. The control module may monitor the status of a number of fuses on the board and may communicate the status of those fuses to the vehicle driver. In general the power distribution module is much more compact than other known power distribution systems for vehicles such as coaches or buses. In some embodiments, the power distribution module may allow a user to combine all fuse modules for a coach or bus into one component and allow for additional room for expansion if necessary. Although the power distribution module may be made using any known method, in some embodiments, the distribution module may be constructed using press-fit technology (with no soldering).

Turning now to FIGS. 1A-1F, an exemplary power distribution module or panel 50 is shown. The panel has a top side 52 and a bottom side 54, and an outer perimeter having a top edge 56, a bottom edge 58, a first edge 60 and a second edge 62. As shown in FIG. 1A, the top edge 56 is positioned opposite of the bottom edge 58 and the first edge 60 is positioned opposite of the second edge 62. Although the panel 50 as shown in FIG. 1A has a generally rectangular shape, the panel may have other shapes including for example, triangular, octagonal, hexagonal, and circular.

The panel 50 may include a plurality of input terminals positioned on the panel proximate to the top edge 56. In the embodiment shown in FIG. 1A, input terminals 101, 102, 103, and 104 are positioned proximate to the top edge 56 of the panel 50 closer to the first edge 60 than the second edge 62. Although four input terminals 101, 102, 103, and 104 are displayed in FIG. 1A, any number of input terminals may be used.

As shown in FIG. 1A-1F input terminals 101, 102, 103, and 104 may comprise a stud or other connection mechanism. The input terminals may be configured to be connected to a number of different power sources. For example, and as will be discussed in more detail below, input terminals 101 and 102 may be connected to a first power supply and input terminals 103 and 104 may be connected to a second power supply. In some embodiments one of the first power supply and the second power supply may have a higher voltage than the other of the first power supply and the second power supply. In one embodiment, for example, at least one of the input terminals is configured to be connected to a 12-volt power source and at least one of the input terminals is configured to be connected to a 24-volt power source. Additionally, the input terminals may be configured to connect to a switched power supply, which includes a disconnect between the power source and the board, and/or a hot power, which does not include a disconnect between the power source and the panel 50. In one example, input terminal 101 may be connected to a 24-volt switched power supply, input terminal 102 may be connected to a 24-volt hot power supply, input terminal 103 may be connected to a 12-volt switched power supply, and input terminal 104 may be connected to a 12-volt hot power supply Advantageously, in various embodiments, the input terminals 101, 102, 103, 104 may be different sizes including having different diameters. This may help avoid confusion for a technician responsible for connecting the correct power source to the correct input terminal 101, 102, 103, 104. For example, in some embodiments, the input terminals connected to the higher voltage power supply (e.g., 24-volt power) may be smaller than the input terminals corresponding to the lower voltage power supply (e.g., 12-volt power) and/or the input terminals connected to the hot power may be smaller than the input terminals corresponding to the switched power supply. Advantageously this may ensure that the higher voltage power supply (e.g., 24-volt power) cannot be attached to the input terminals configured for attachment to the lower voltage power supply (e.g., 12-volt power). Advantageously this may ensure that the hot power cannot be attached to the input terminals configured for attachment to the switched power. For example, in one embodiment, the input terminal connected to the hot lower voltage power supply (e.g., 12-volt power) may be smaller than the input terminal connected to the switched lower voltage power supply (e.g., 12-volt power), and the input terminal connected to the hot higher voltage power supply (e.g., 24-volt power) may be smaller than the input terminal corresponding to the switched higher voltage power supply (e.g., 24-volt power).

In addition to the input terminals described above, the panel 50 includes a plurality of output terminals which may be located primarily along an edge and/or edges 56, 58, 60, 62 of the panel 50. Each output terminal may be connected to one of the input terminals 101, 102, 103, and 104, and may include one or more fuses or other devices connected in between the input terminal and respective output terminal. The output terminals may be generally similar in construction to the input terminals. In various embodiments, the output terminals positioned proximate to the bottom edge 58 may include output terminals connected to each of the four input terminals 101, 102, 103, and 104. Additionally or alternatively, the output terminals positioned proximate to the side edge 62 may include output terminals connected to each of the four input terminals 101, 102, 103, and 104. Consequently, a 24-volt switched power output, a 24-volt hot power output, a 12-volt switched power output, and a 12-volt hot power output may all be located along a single edge.

Referring now more specifically to FIGS. 1A-1F, the panel 50 may include a plurality of output terminals 111, 112, and 113. The output terminals 111, 112, and 113 may be generally similar in construction to the input terminals. As seen in FIG. 1A. In some embodiments, the panel may include output terminals 111, 112, and 113 configured to connect to an equalizer and/or inverter.

Figure 2:
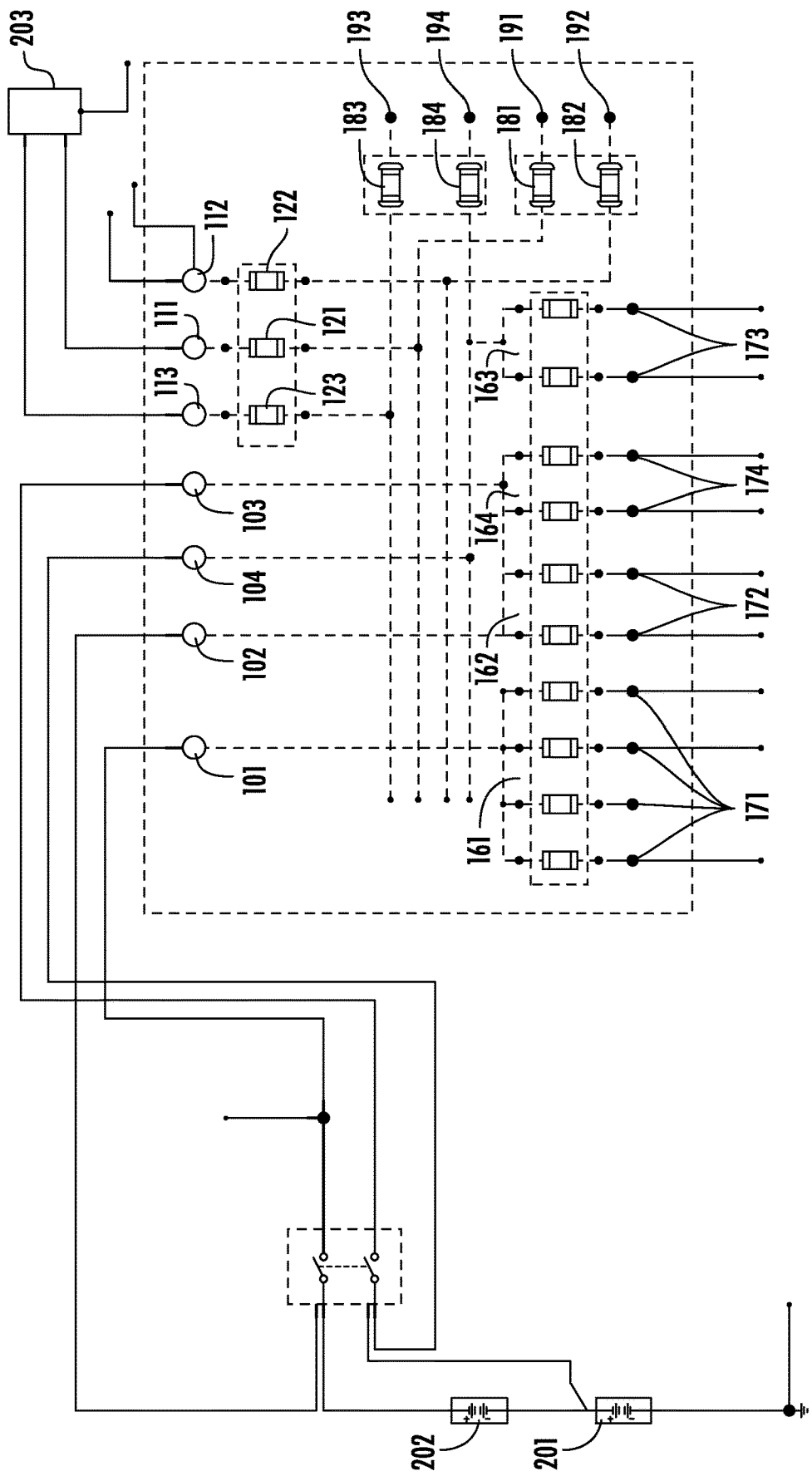
FIG. 2 illustrates a block circuit diagram showing a portion of an exemplary panel as according to aspects of this disclosure.
Figure 3:
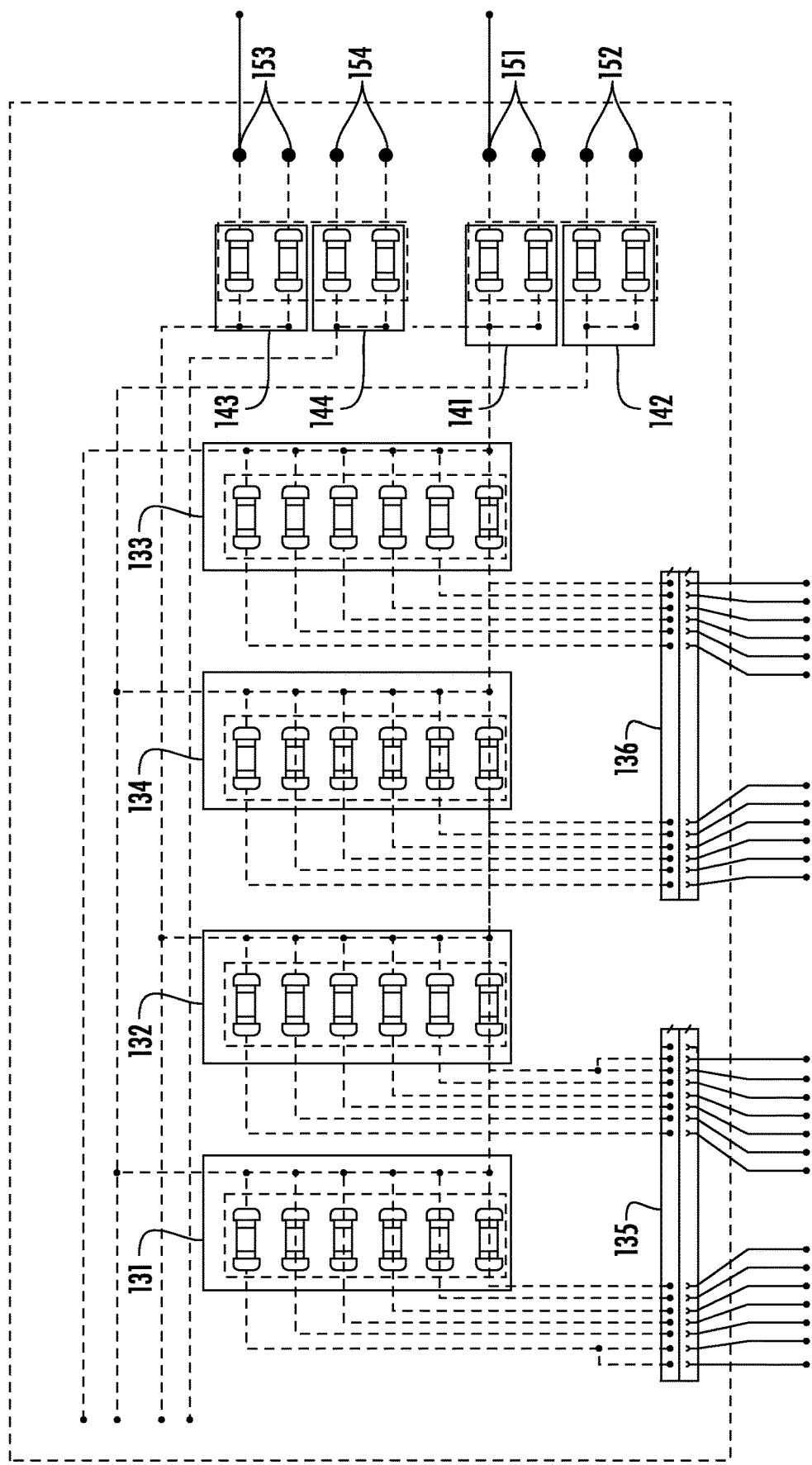
FIG. 3 illustrates a block circuit diagram showing a portion of an exemplary panel as according to aspects of this disclosure.

The equalizer output terminals 111 and 113 may be used when the panel or board is connected to a bus with multiple power sources. For example, a coach or bus may provide power from two sources, the engine when it is running and one or more batteries. In some situations, and as can be seen in the circuit drawing in FIG. 2, a coach or bus may use two 12-volt batteries 201 and 202 in series. A coach or bus may further have an alternator that uses 24-volts. In these situations, an equalizer 203 may be necessary to ensure both batteries are charged equally.

In one embodiment, as shown in FIG. 1A, the panel 50 may include a 12-volt equalizer output terminal 113, a 24-volt equalizer output terminal 111, and an inverter output terminal 112. The output terminals 111, 112, and 113 may be positioned on the same edge 56 as the input terminals 101, 102, 103, and 104 or otherwise near the input terminals 101, 102, 103, and 104. As shown in FIG. 1A, these output terminals 111, 112, and 113 may be positioned proximate to the top edge 56 and closer to the second edge 62 than the first edge 60. Advantageously, positioning the input terminals 101, 102, 103, and 104, equalizer output terminals 111, 113, and inverter output terminal 112 along the same edge as each other may allow for shorter cables if the power source is very close to the equalizer.

As shown in FIGS. 1A-1F and FIG. 2, the 12-volt equalizer output terminal 113 may be connected to the 12-volt switched power input 103 with a fuse 123 connected in between. Likewise, the 24-volt equalizer output terminal 111 may be connected to the 24-volt switched power input 101 with a fuse 121 connected in between. The inverter output terminal 112 may be connected to the 24-volt hot power input 102 with a fuse 122 in between. In various embodiments, fuses 121-123 may be rated for 125 amps or 150 amps, as can be seen in the example schematic shown in FIG. 2.

In addition to the outputs described above, the panel 50 may include a number of additional outputs. In an example layout, the high current or major outputs may be positioned along a single edge of the panel 50. In one example, the power distribution module 50 may include a first plurality of output terminals 171, 172, 173, and 174 positioned on the panel 50 proximate the bottom edge 58 of the panel. Each terminal 171, 172, 173, and 174 of the first plurality of output terminals may comprise a stud or other connection mechanism. Each individual terminal of the first plurality of output terminals 171, 172, 173, and 174 may be connected to one of the input terminals 101, 102, 103, or 104. The power distribution module 50 may also include a first plurality of fuses 161, 162, 163, and 164. Each individual fuse of the first plurality of fuses 161, 162, 163, and 164 is connectable between each individual output terminal of the first plurality of output terminals 171, 172, 173, and 174 and the respective input terminal 101, 102, 103, or 104 that it is connected to. In some embodiments the first plurality of fuses 161, 162, 163, and 164 may be comprised of individual fuses rated for currents of 50 amps to 80 amps.

In this example, output terminals 171 are connected to the 12-volt switched power input terminal 101 through fuses 161. Output terminals 172 are connected to the 12-volt hot power input terminal 102 through fuses 162. Output terminals 173 are connected to the 24-volt hot power input terminal through fuses 163. And output terminals 174 are connected to the 24-volt switched power input terminals 104 through fuses 164. In various embodiments, to support the higher current output terminals, MIDI fuses may be used for the fuses at 161-164. In various embodiments, fuses 161-164 may be rated for 50 amps or higher. In various embodiments, fuses 161 may be rated for 80 Amps or higher, and fuses 162-164 may be rated for 50 Amps.

Additional output terminals may be located along a second edge. The power distribution module 50 may include a second plurality of output terminals 151, 152, 153, and 154 positioned on the panel proximate the first edge of the panel 62 as shown in FIGS. 1A-1F and FIG. 3. Each of the second plurality of output terminals 151, 152, 153, and 154 may comprise a stud or other connection device. Each individual terminal of the second plurality of output terminals 151, 152, 153, and 154 may be connected to one of one of the input terminals 101, 102, 103, or 104. The power distribution module 50 may also include a second plurality of fuses 141, 142, 143, 144. And each individual fuse of the second plurality of fuses 141, 142, 143, 144 is connectable between each output terminal of the second plurality of output terminals 151, 152, 153, and 154 and the respective input terminal 101, 102, 103, or 104. In some embodiments, the second plurality of fuses may be comprised of individual fuses rated for currents of 40 amps or less.

The power distribution module 50 may include a third plurality of output terminals 191, 192, 193, and 194 positioned on the panel 50 proximate the first edge of the panel 62 as shown in FIGS. 1A-1F and FIG. 2. Each of the third plurality of output terminals 191, 192, 193, and 194 may comprise a stud or other connection device. Each individual terminal of the third plurality of output terminals 191, 192, 193, and 194 may be connected to one of the input terminals 101, 102, 103, or 104. The power distribution module 50 may also include a third plurality of fuses 181, 182, 183, 184. Each individual fuse of the third plurality of fuses 181, 182, 183, 184 may be connectable between each output terminal of the third plurality of output terminals 191, 192, 193, and 194 and the respective input terminal 101, 102, 103, or 104. In some embodiments, the third plurality of fuses 181, 182, 183, 184 is comprised of individual fuses may be rated for currents of 70 amps or less.

Additional, lower current output terminals, supporting lower current than output terminals along the edges may be positioned away from the edges, towards the center of the panel 50. The lower current output terminals may use connector output terminals, as opposed to stud output terminals as shown with regard to output terminals 111-113, 151-154, 171-174, and 191-194.

The power distribution module 50 may include a fourth plurality of output terminals 135 and 136 positioned on the panel. Each of the fourth plurality of output terminals 135 and 136 may comprise a connection type other than a stud. Each of the fourth plurality of output terminals may be connected to one of one of the input terminals 101, 102, 103, or 104. The power distribution module 50 may include a fourth plurality of fuses 131, 132, 133, 134. Each fuse of the fourth plurality of fuses 131, 132, 133, 134 may be connectable between each output terminal of the fourth plurality of output terminals 135, 136 and the respective input terminal 101, 102, 103, or 104. In some embodiments, the fourth plurality of fuses 131, 132, 133, 134 may be comprised of individual fuses rated for currents of 25 amps or less or of 20 amps or less. In the example shown in FIGS. 1A-1F and 3, output terminals 135 are connected to the 24-volt inputs 101 and 102 through fuses 131 and 132, whereas output terminals 136 are connected to the 12-volt inputs 103 and 104 through fuses 133 and 134. In various embodiments fuses 131-134 may be rated for below 25 amps, or below 20 amps.

As one skilled in the art will appreciate, the positioning of the inputs, outputs, and fuses described above are merely exemplary and may be changed as necessary. Further, the precise number of fuses and outputs shown in FIGS. 1-4 is also exemplary. For example, as shown in FIGS. 1A-1F, the first edge 60 does not include any output terminal studs. This design is compatible with coaches or busses or other vehicles that do not provide access to one side of the panel or board. One skilled in the art will appreciate that in some embodiments a different edge may not include any output terminals.

Advantageously the power distribution module 50 may support multiple current levels and multiple fuse types. Example fuse types that may be used include but are not limited to MIDI fuses, MAXI fuses, ATC fuses, and AMI fuses. In various embodiments, and as described above, the fuses and outputs may be grouped based on amp rating. For example, as seen in FIG. 1A, the equalizer output terminals 111 and 113, inverter output terminal 112, and the output terminals 171-174 are all connected to the input terminals via fuses with higher current ratings, with current ratings up to 200 Amps, such as the MIDI fuses. Additionally or alternatively, output terminals 191-194 are connected to the input terminals via fuses 181-184 with a medium current ratings, with Amp ratings up to 70 amps, such as the MAXI fuses. Output terminal studs 151-154 may be connected to the input terminals through fuses 141-144 supporting a lower current such as ATC or MINI fuses. Finally, in various embodiments including connector output terminals 135 and 136, low current fuses 131-134 such as ATC or MINI fuses may be used.

Another feature of various embodiments of the present power distribution module 50 is that the panel or board is capable of supporting multiple connection interfaces. Output terminals may be studs or plug-in type connectors, or other known types of output terminals. A connector output terminal may require a lower current level, such as below 25 amps or below 20 amps. A stud output terminal can be configured to support a higher current than a connector output terminal. As an example, fuses connected to a stud output terminal may have an amp rating as high as 50 amps, 80 amps, or 200 amps. Stud output terminals corresponding to higher current levels may use larger studs than output terminals corresponding to lower current levels.

In various embodiments the power distribution module 50 may include a port for a communication module 105. The communication module (not shown) may be used to monitor certain preselected fuses. The communication module may send a signal, using for example J1939 communication protocol, that may alert a user, such as a driver or mechanic, the status of the certain preselected fuses. In some embodiments, the communication module may be capable of monitoring up to five fuses, and in other embodiments the communication module may be capable of monitoring each fuse on the power distribution module 50. In some embodiments, the communication module may be a CAN bus. In some embodiments the power distribution module 50 may not include the communication module 105. In various embodiments, the power distribution module 50 may also include a port 106 for a control module (not shown). The control module may control one or more aspects of the panel 50.

Figure 4:
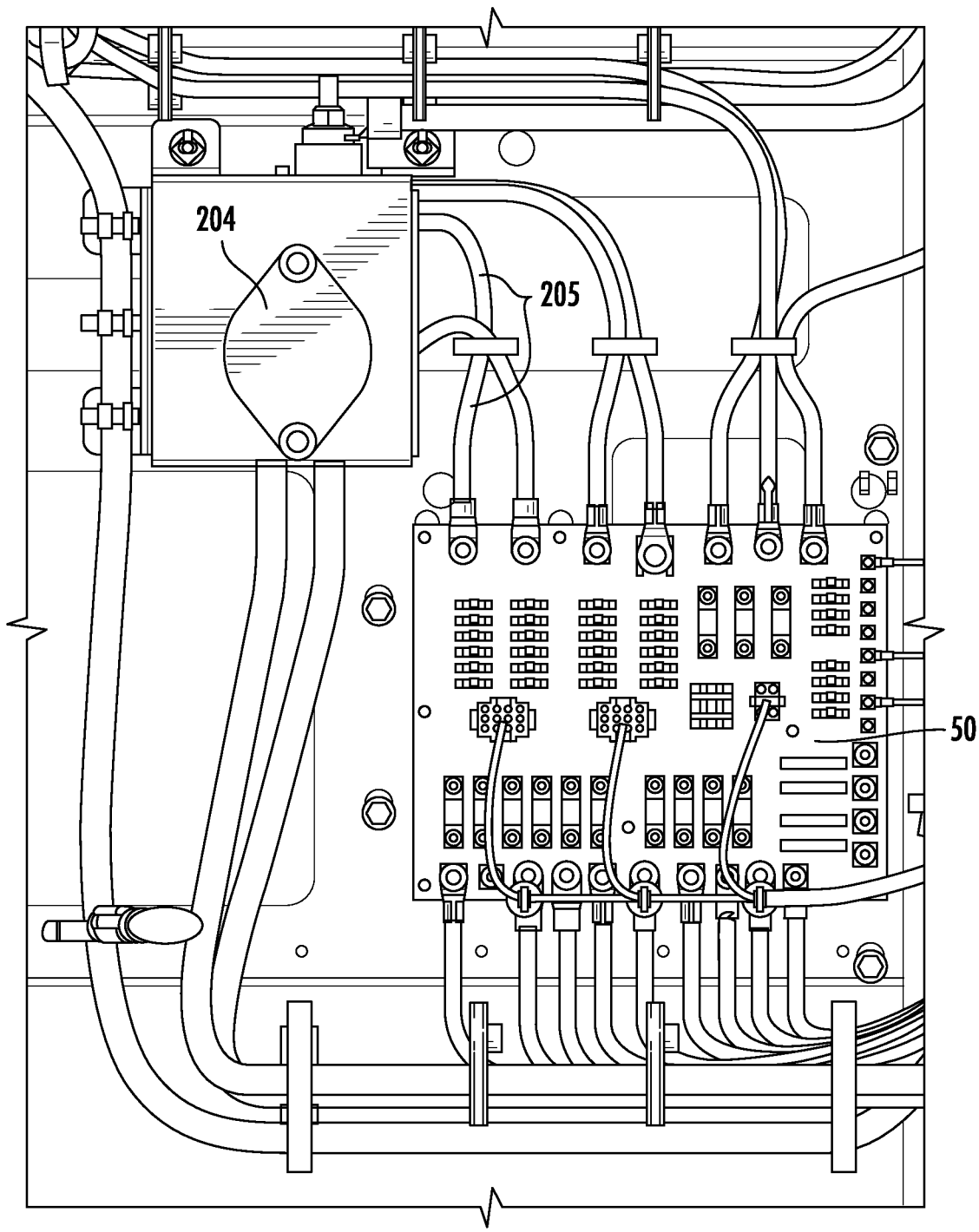
FIG. 4 illustrates a top view of an exemplary panel may be installed in a coach or bus according to aspects of this disclosure.

An advantage of the example layout depicted in FIGS. 1A-1F is that it may provide easier access to the input and output terminals configured for higher current by placing these proximate to the edges of the panel or board. As cables capable of carrying high current loads are generally bigger and more difficult to route, it may be advantageous to locate the high current input and output terminals along the edge. Since cables configured to carry a lower current and/or cables carrying signals from the control and communication terminal are generally smaller and easier to maneuver, low current outputs, communication outputs, and the control box are positioned on the interior of the panel or board surface. FIG. 4 shows an example of how a panel 50 may be connected to a coach or bus, including the relative size of exemplary cables. As can be appreciated, cables of sizes other than those shown in FIG. 4 may also be used.

Additionally, it may be advantageous to locate certain inputs and output terminals along the edge closest to the device to which the input and output terminals will connect to. For example, as shown in FIG. 4, on some coaches, the cable 205 from the input terminals 101-104 to disconnect 204 may be short, such as less than a foot in length. Additionally, the equalizer (now shown) may be located nearby. Thus, as shown in FIG. 4, it may be advantageous for the input terminals 101-104 and equalizer output terminals 111-113 along the same edge 56 to minimize cable length.

Additionally, advantageously, and as described above, the panel 50 may include a combination of the previously described features and also fit in a constrained or limited space. In various embodiments, a panel 50 may be limited to 8.5 inches (21.59 cm) by 11 inches (27.94 cm), or may even be limited to 7.5 inches (19.05 cm) by 10.5 inches (26.67 cm). For example, the power distribution module may have a length of the top edge 56 and a length of the bottom edge 58 that are each less than or equal to 11 inches (27.94 cm), and a length of the first edge 60 and a length of the second edge 62 that are each less than or equal to 8.5 inches (21.59 cm). In another example, the power distribution module 50 may have a length of the top edge 56 and a length of the bottom edge 58 each of between 10 inches (25.4 cm) and 12 inches (30.48 cm), and a length of the first edge 60 and a length of the second edge 62 that are each between 7 inches (17.78 cm) and 9 inches (22.86 cm). An efficient layout as described throughout the specification may make it possible for the panel or board to receive multiple inputs of different power levels and/or different power types and also provide numerous outputs at one or more power levels and/or of one or more power types and/or at one or more different current levels.

Further, advantageously, panels 50 described herein include the ability for a single panel 50 to handle multiple power inputs, as well as high currents. This may include inputs at different voltage levels, such as at 12-volts and 24-volts. This may additionally or alternatively include both a switched power input and a hot power input. Panels 50 described herein may be capable of handling currents up to 1000 Amps.

The power distribution module 50 may be formed by any known method. In some embodiments, the power distribution module 50 may be formed of separate layers such that connections between each input 101, 102, 103, and 104 and their associated outputs are each on separate layers. Theses layers, which have electrical connections, may be separated by layers which have insulating material such as ceramic. Therefore, with regard to the example shown in FIGS. 1A-1F, each of the four inputs 101, 102, 103, and 104 may have its own layer including all connections between the input and the associated outputs. Between these layers having electrical connections may be layers of insulation. In various embodiments, the panel or board may be constructed using press fit technology. Press-fit technology may allow the panel or board to be constructed with no soldering.

Figure 5A:
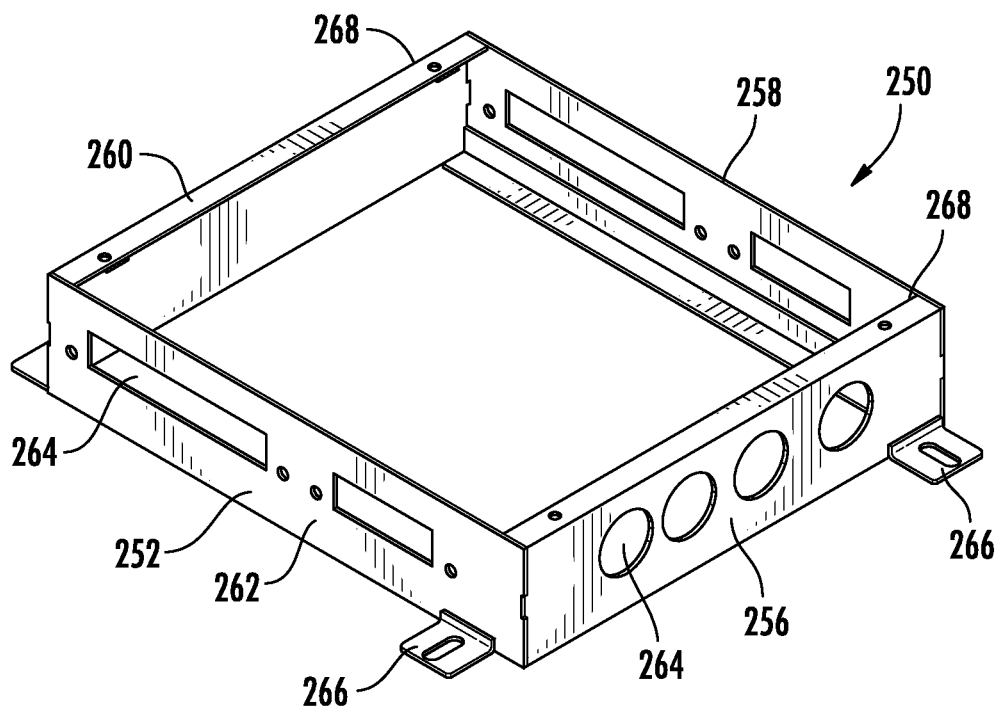
FIG. 5A illustrates a perspective view of an exemplary base portion of a cover according to aspects of this disclosure.
Figure 5B:
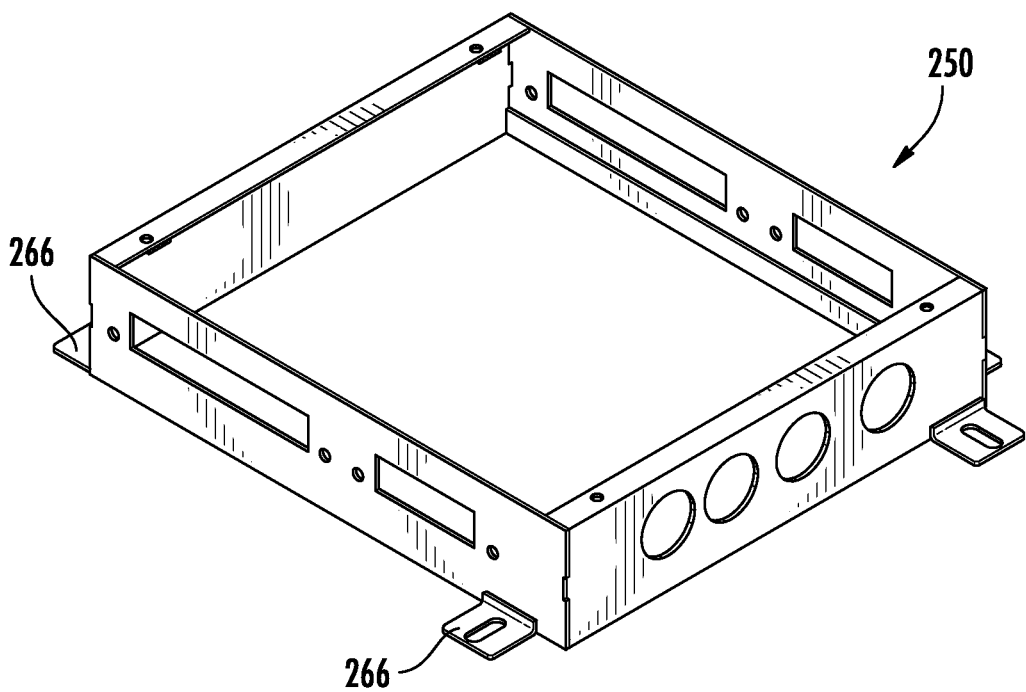
FIG. 5B illustrates a perspective view of an exemplary base portion of a cover according to aspects of this disclosure.
Figure 5C:
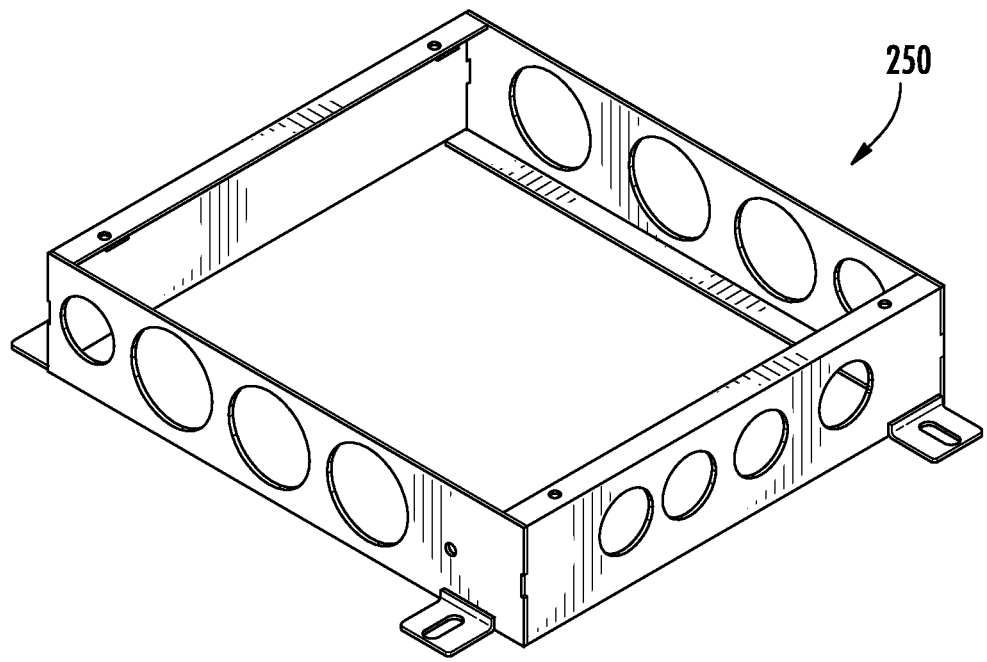
FIG. 5C illustrates a perspective view of an exemplary base portion of a cover according to aspects of this disclosure.
Figure 5D:
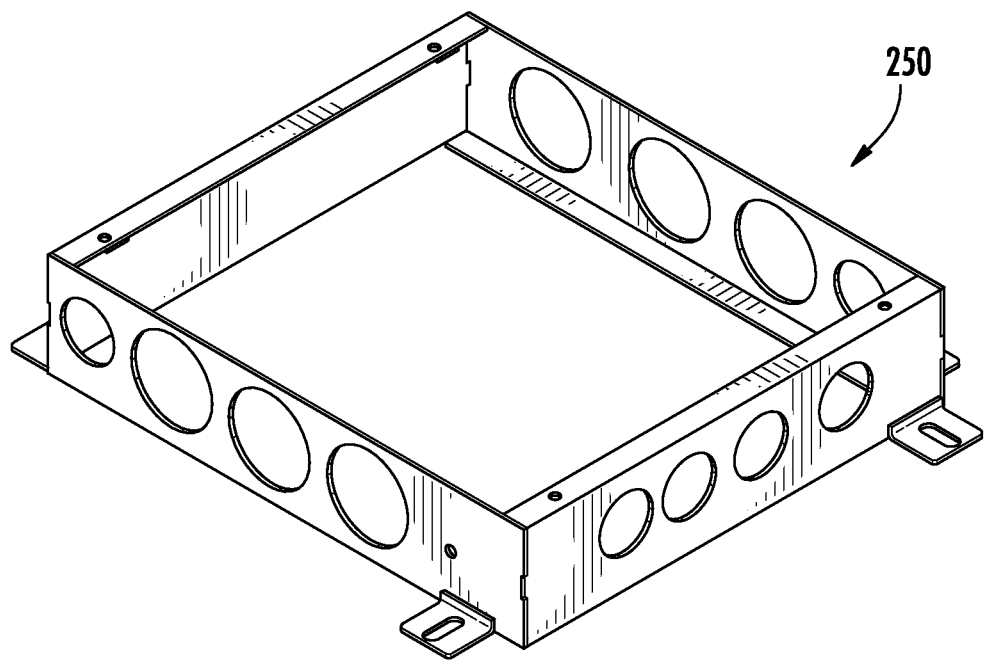
FIG. 5D illustrates a perspective view of an exemplary base portion of a cover according to aspects of this disclosure.
Figure 5E:
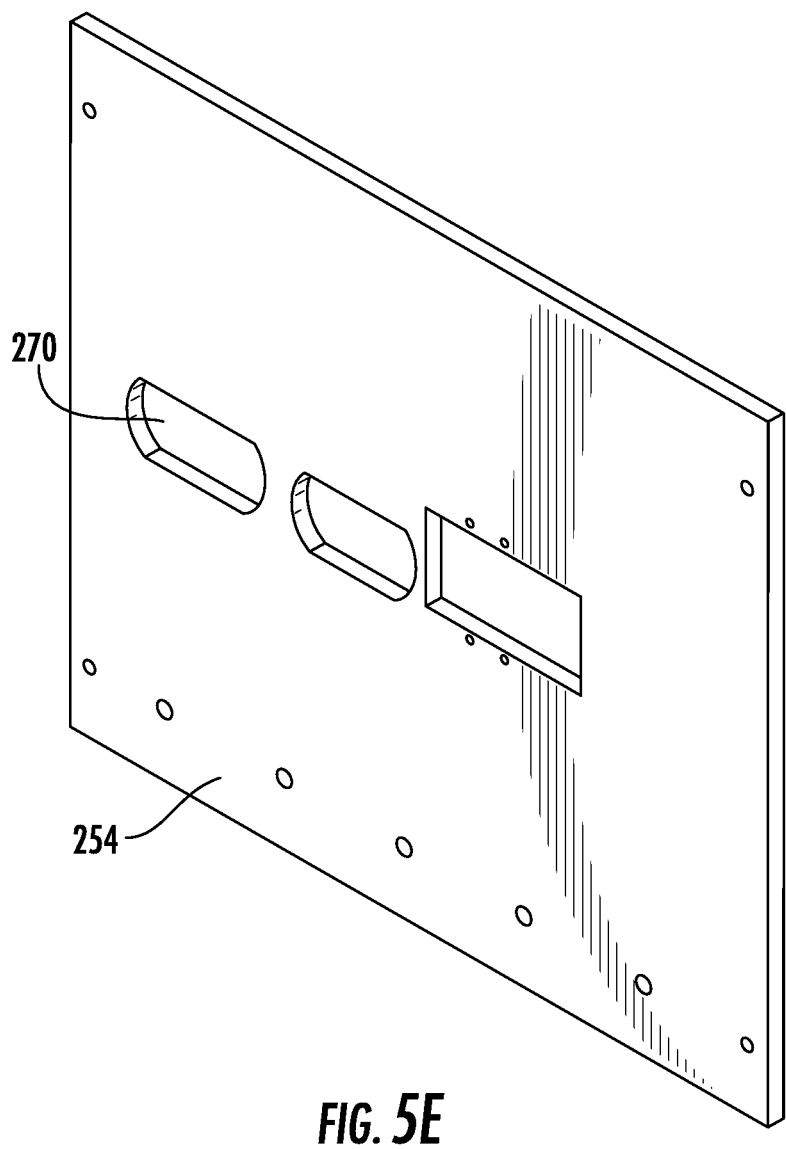
FIG. 5E illustrates a face plate of a cover according to aspects of this disclosure.

In various embodiments, the power distribution module 50 may include a cover 250 to enclose or partially enclose the power distribution module 50. In some embodiments, the cover 250 may include a base portion 252 and a cover plate 254. Exemplary base portions 252 are shown in FIGS. 5A-5D and an exemplary cover plate 254 is shown in FIG. 5E. The base portion 252 may include four side walls 256, 258, 260, and 262 and each of the side walls may include apertures 264. As shown in FIGS. 5A-5D, the apertures may be any suitable shape including for example rectangular and circular, as shown, but may be any other shape including triangular or oval. As will be discussed in greater detail below, cables connected to other portions of the coach may pass through the apertures 264 to connect other portions of the coach to the power distribution module 50. The base portion 252 may also include one or more fastening tabs 266 which may be used to fasten the cover 250 to a portion of the coach or bus such that the cover encloses the power distribution module 50. As shown in FIGS. 5A-5D, the fastening tabs 266 may be located at any suitable location on the base portion 252. The base portion 252 may also include one or more fastening tabs 268 which may be used to removably engage the cover plate 254 with the base portion 252.

An exemplary cover plate 254 is shown in FIG. 5E. The cover plate 254 may also include one or more apertures 270. The apertures 270 may be any suitable shape including for example rectangular, circular, triangular, or oval. As will be discussed in greater detail below, cables connected to other portions of the coach may pass through the apertures 270 to connect other portions of the coach to the power distribution module 50.

Advantageously the cover plate 254 is removably engaged with the base portion 252 such that a user can easily remove the cover plate 254 to service the power control module 50. This allows easy access to the power distribution module 50 to replace any fuses and or adjust the connections of any cables connecting to the power distribution module 50.

Figure 5F:
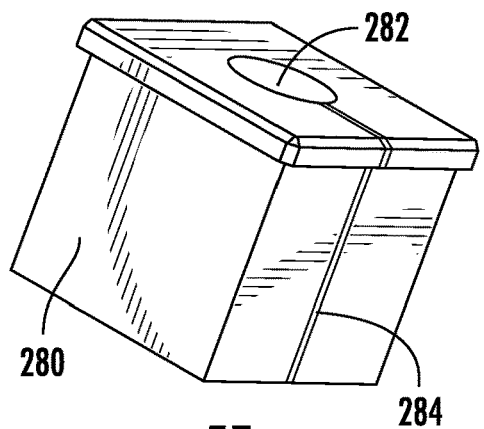
FIG. 5F illustrates a grommet according to aspects of this disclosure.
Figure 5G:
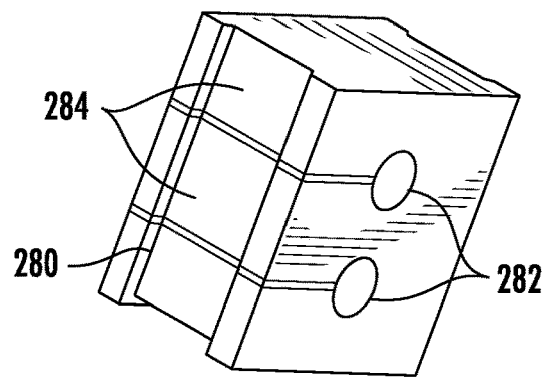
FIG. 5G illustrates a grommet according to aspects of this disclosure.
Figure 6:
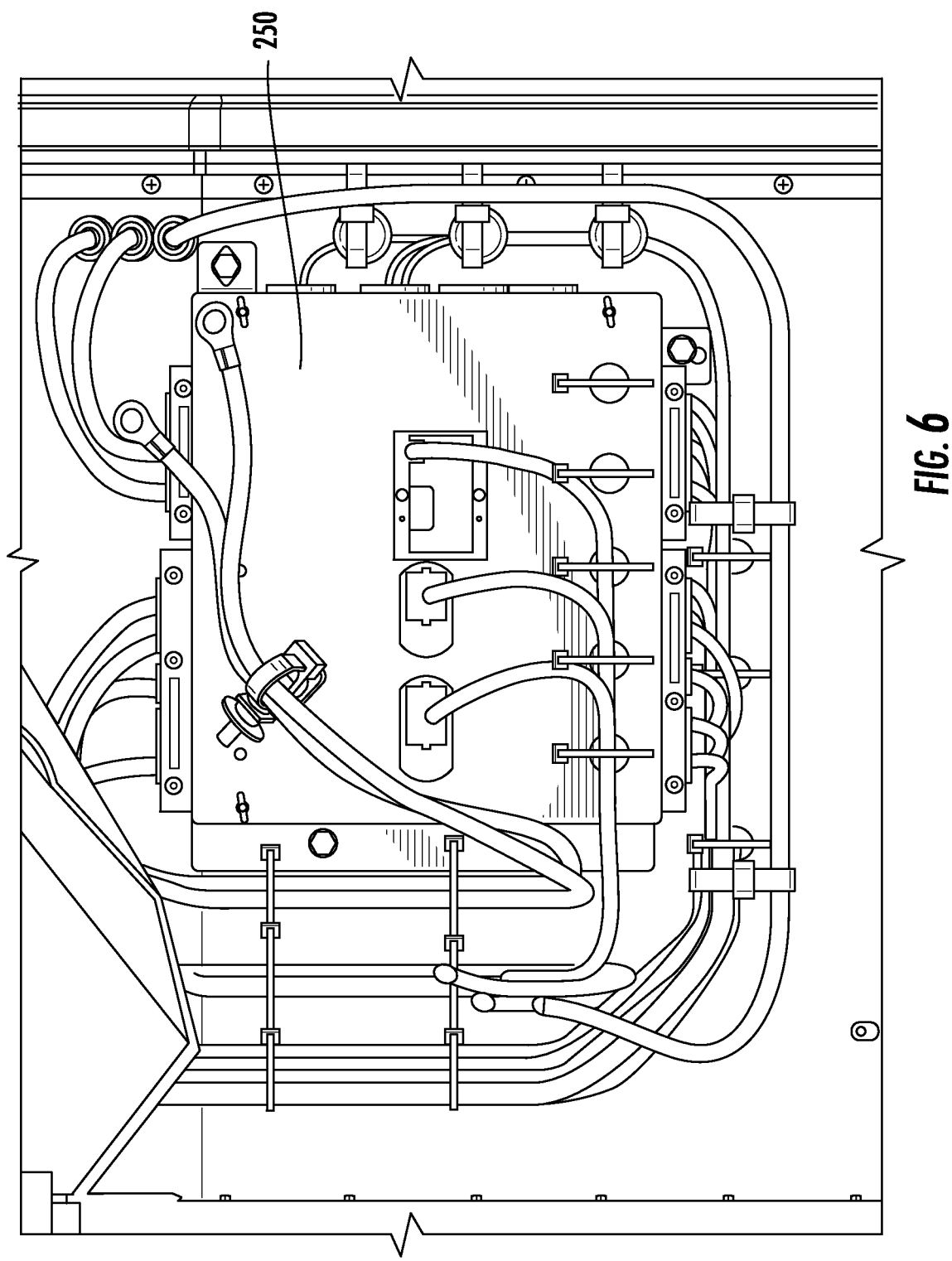
FIG. 6 illustrates a top view of an exemplary panel installed in a coach or bus according to aspects of this disclosure.

An exemplary cover 250 installed in a coach is shown in FIG. 6. As shown in FIG. 6, cables may pass through apertures 264 and 270. In some embodiments, the cover may include one or more grommets to seal the apertures. Exemplary grommets 280 are shown in FIGS. 5F and 5G. As shown in FIGS. 5F and 5G, the grommets 280 may include a passageway 282 through which a cable may travel and an insertion portion 284. The insertion portion 284 may be flexible to allow for insertion of a cable through the grommet 280. As shown in FIGS. 5F and 5G, each grommet 280 may include one or more passageways 282. Additionally, each passageway 282 may be any appropriate size to accommodate the cable passing through the passageway 282.

Figure 5H:
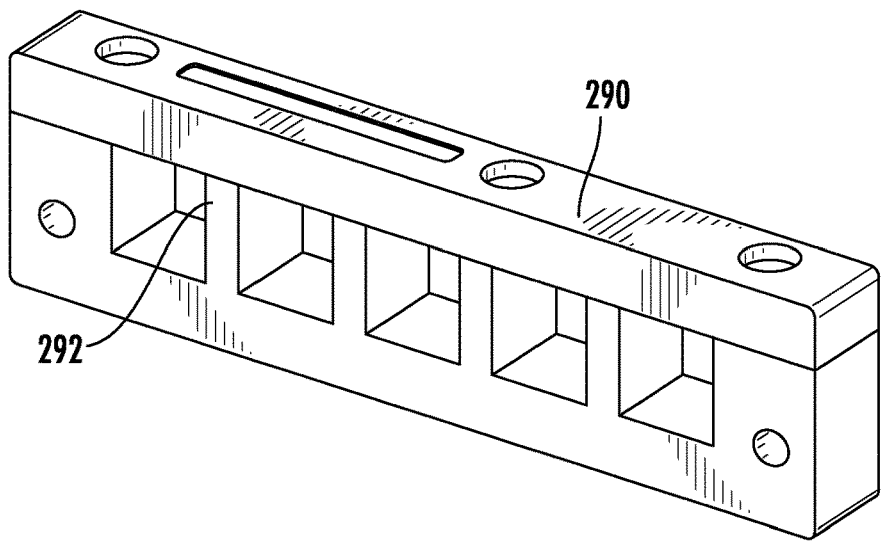
FIG. 5H illustrates a grommet frame according to aspects of this disclosure.
Figure 5I:
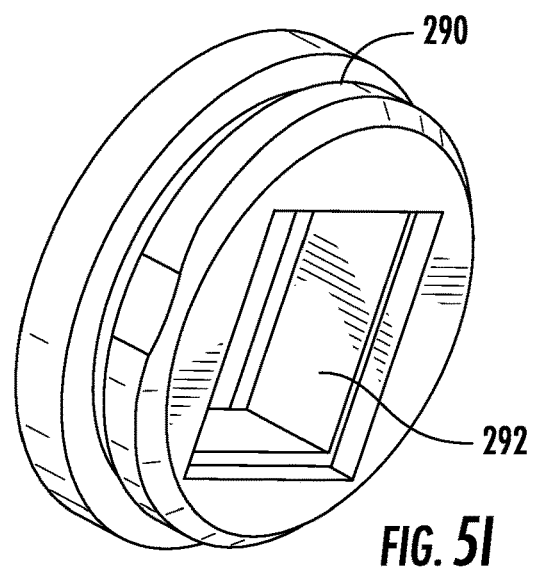
FIG. 5I illustrates a grommet frame according to aspects of this disclosure.

The grommets 280 may be engaged directly into the apertures 264, 270 or in some embodiments the grommets may be engaged with a frame 290 and the frame 290 may be engaged with the aperture 264, 270. Exemplary frames 290 are shown in FIGS. 5H and 5I The frames 290 may be any shape including rectangular and circular as shown and may include one or more apertures 292 to engage the grommets 280.

Although one method of removably connecting the cover 250 to the coach is shown in FIGS. 5 and 6, many other removable connections may be used. In some examples, the cover 250, or portions of the cover such as the cover plate 250, may include one or more magnets to hold the cover to the coach. In another example, the cover 250 may include a hook and loop fastening system. In still other examples the cover 250 may include press-fit connecting mechanisms.

In some embodiments the cover 250 may protect the power distribution module 50 from the outside elements. The cover 250 may protect the panel 50 from dust. For example in some embodiments the cover may stop all ingress of dust and/or may be dust tight. The cover 250 may protect the panel 50 against water such that it is waterproof when tested for 30 minutes under 1 meter of water. In some embodiments, the housing 102 may be capable of achieving an IP67 rating which specifies that ingress of water in harmful quantities is not possible when the enclosure is immersed in water under defined conditions of pressure and time (up to 1 m of submersion). The IP67 test is 30 minutes long and the enclosure is tested with the lowest point of the enclosure 1000 mm below the surface of the water, or the highest point 150 mm below the surface whichever is deeper While various embodiments have been described, it will be apparent to those of ordinary skill in the art that many more embodiments and implementations are possible that are within the scope of the claims. The various dimensions described above are merely exemplary and may be changed as necessary. Accordingly, it will be apparent to those of ordinary skill in the art that many more embodiments and implementations are possible that are within the scope of the claims. Therefore, the embodiments described are only provided to aid in understanding the claims and do not limit the scope of the claims.

The invention claimed is:

1. A vehicle power distribution system, the vehicle power distribution system comprising:
    a first power supply;
    a second power supply;
    a multi-layer panel having a top side and a bottom side and having a perimeter, the perimeter of the panel comprising a top edge, a bottom edge, a first edge and a second edge wherein the top edge is positioned opposite of the bottom edge and the first edge is positioned opposite of the second edge;
    a plurality of input terminals positioned on the panel and proximate to the top edge, the plurality of input terminals comprising:
        a first input terminal connected to a hot input from the first power supply;
        a second input terminal connected to a switched input from the first power supply;
        a third input terminal connected to a hot input from the second power supply; and
        a fourth input terminal adapted for connection to a switched input from the second power supply;
    a first plurality of output terminals positioned on the panel proximate the bottom edge of the panel, each of the first plurality of output terminals comprising a stud, and each of the first plurality of output terminals connected to one of the first input terminal, the second input terminal, the third input terminal, or the fourth input terminal;
    a first plurality of fuses wherein a single fuse of the first plurality of fuses is connectable between each output terminal of the first plurality of output terminals and the respective input terminal, and wherein the first plurality of fuses is comprised of individual fuses rated for currents of 50 amps to 80 amps;
    a second plurality of output terminals positioned on the panel proximate the first edge of the panel, each of the second plurality of output terminals comprising a stud, and each of the second plurality of output terminals connected to one of the first input terminal, the second input terminal, the third input terminal, or the fourth input terminal;
    a second plurality of fuses wherein a single fuse of the second plurality of fuses is connectable between each output terminal of the second plurality of output terminals and the respective input terminal, and wherein the second plurality of fuses is comprised of individual fuses rated for currents of 40 amps or less;
    a third plurality of output terminals positioned on the panel proximate the first edge of the panel, each of the third plurality of output terminals comprising a stud, and each of the third plurality of output terminals connected to one of the first input terminal, the second input terminal, the third input terminal, or the fourth input terminal; and
    a third plurality of fuses wherein a single fuse of the third plurality of fuses is connectable between each output terminal of the third plurality of output terminals and the respective input terminal, and wherein the third plurality of fuses is comprised of individual fuses rated for currents of 70 amps or less;
    a fourth plurality of output terminals positioned on the panel, each of the fourth plurality of output terminals comprising a connection type other than a stud, and each of the fourth plurality of output terminals connected to one of the first input terminal, the second input terminal, the third input terminal, or the fourth input terminal; and
    a fourth plurality of fuses wherein a single fuse of the fourth plurality of fuses is connectable between each output terminal of the fourth plurality of output terminals and the respective input terminal, and wherein the fourth plurality of fuses is comprised of individual fuses rated for currents of 25 amps or less;
    a communication module positioned on the multi-layer panel;
    a first equalizer output terminal connected to the first input terminal;
    a second equalizer output terminal connected to the second input terminal; and
    wherein the distance between the top edge and the bottom edge does not exceed 8.5 inches (21.59 cm) and the distance between the first edge and the second edge does not exceed 11 inches (27.94 cm); and
    wherein the voltage supplied by the first power supply is different than the voltage supplied by the second power supply; and
    wherein there are no output terminals proximate the first edge.

2. The vehicle power distribution system of claim 1, wherein the communication module positioned is configured to alert a user if at least one predetermined fuse of one of the first plurality of fuses, the second plurality of fuses, the third plurality of fuses, and the fourth plurality of fuses is blown.

3. The vehicle power distribution system of claim 2, wherein the first equalizer output terminal is positioned on the panel proximate to the top edge; and the second equalizer output terminal is positioned on the panel proximate to the top edge.

4. A vehicle power distribution module, the vehicle power distribution module comprising:
- a panel having a top side and a bottom side and having a perimeter, the perimeter of the panel comprising a top edge, a bottom edge, a first edge and a second edge, wherein the top edge is positioned opposite of the bottom edge and the first edge is positioned opposite of the second edge;
- a plurality of input terminals positioned on the panel proximate to the top edge, the plurality of input terminals comprising:
  - a first input terminal adapted for connection to a first power supply, and
  - a second input terminal adapted for connection to a second power supply;
- a first plurality of output terminals positioned on the panel proximate to the bottom edge, wherein the first plurality of output terminals is connected to the first input terminal;
- a first plurality of fuses connected between the first input terminal and the first plurality of output terminals, the first plurality of fuses positioned on the panel proximate to the first plurality of output terminals such that the first plurality of output terminals is positioned between the first plurality of fuses and the bottom edge;
- a second plurality of output terminals positioned on the panel proximate to the bottom edge, wherein the second plurality of output terminals is connected to the second input terminal; and
- a second plurality of fuses connected between the second input terminal and the second plurality of output terminals, the second plurality of fuses positioned on the panel proximate to the second plurality of output terminals such that the second plurality of output terminals is positioned between the second plurality of fuses and the bottom edge;
- an inverter output terminal connected to one of the first input terminal or the second input terminal;
- wherein the voltage of the first power supply is different than the voltage of the second power supply;
- wherein there are no output terminals proximate the first edge; and
- wherein a diameter of the first input terminal is different than a diameter of the second input terminal.

5. The vehicle power distribution module of claim 4, wherein the voltage of the first power supply is 24 volts and the voltage of the second power supply is 12 volts.

6. The vehicle power distribution module of claim 5, wherein the inverter output terminal is connected to the first input terminal.

7. The vehicle power distribution module of claim 4, further comprising:
- a first equalizer output terminal connected to the first input terminal and a second equalizer output terminal connected to the second input terminal, the first equalizer output terminal and the second equalizer output terminal positioned on the panel proximate to the top edge.

8. The vehicle power distribution module of claim 4, further comprising:
- a third plurality of output terminals connected to the first input terminal, and
- a third plurality of fuses connected between the first input terminal and the third plurality of output terminals, wherein the first plurality of fuses uses a first fuse type, the second plurality of fuses uses a second fuse type, and the third plurality of fuses uses a third fuse type; and wherein the third fuse type is different than the first fuse type and the second fuse type.

9. The vehicle power distribution module of claim 4, further comprising:
- a third input terminal, the third input terminal adapted for connection to a switched input from the first power supply;
- a third plurality of output terminals connected to the third input terminal;
- a third plurality of fuses connected between the third input terminal and the third plurality of output terminals;
- a fourth input terminal, the fourth input terminal adapted for connection to a switched input from the second power supply;
- a fourth plurality of output terminals connected to the fourth input terminal; and
- a fourth plurality of fuses connected between the fourth input terminal and the fourth plurality of output terminals;
- wherein the first input terminal is adapted for connection to a hot input from the first power supply and the second input terminal is adapted for connection to a hot input from the second power supply.

10. The vehicle power distribution module of claim 4, wherein the voltage of the first power supply is 24 volts and the voltage of the second power supply is 12 volts.

11. The vehicle power distribution module of claim 10, wherein a length of the top edge and a length of the bottom edge are each less than or equal to 11 inches (27.94 cm), and wherein a length of the first edge and a length of the second edge are each less than or equal to 8.5 inches (21.59 cm).

12. The vehicle power distribution module of claim 10, wherein a length of the top edge and a length of the bottom edge are each between 10 inches (25.4 cm) and 12 inches (30.48 cm), and wherein a length of the first edge and a length of second edge are each between 7 inches (17.78 cm) and 9 inches (22.86).

13. The vehicle power distribution module of claim 4, wherein the panel is comprised of multiple layers comprising:
- a first layer containing all electrical connections between the first input terminal and the first plurality of output terminals;
- a second layer containing all electrical connections between the second input terminal and the second plurality of output terminals; and
- a third layer composed substantially of insulating material;
- wherein the third layer is positioned between the first layer and the second layer.

14. The vehicle power distribution module of claim 4, wherein the panel is constructed using press fit technology.

15. A vehicle power distribution module, the vehicle power distribution module comprising:
- a plurality of input terminals comprising:
  - a first input terminal adapted for connection to a hot input from a first power supply;
  - a second input terminal adapted for connection to a switched input from the first power supply;
  - a third input terminal adapted for connection to a hot input from a second power supply; and
  - a fourth input terminal adapted for connection to a switched input from the second power supply;

a first plurality of output terminals, wherein each output terminal of the first plurality of output terminals is connected to one of the first input terminal, the second input terminal, the third input terminal, or the fourth input terminal; and a first plurality of fuses, wherein a single fuse of the first plurality of fuses is connectable between each output terminal of the first plurality of output terminals and the respective input terminal;

a second plurality of output terminals, wherein each output terminal of the second plurality of output terminals is connected to one of the first input terminal, the second input terminal, the third input terminal, or the fourth input terminal; and a second plurality of fuses, wherein a single fuse of the second plurality of fuses is connectable between each output terminal of the second plurality of output terminals and the respective input terminal;

a communication module;

wherein each output terminal of the first plurality of output terminals is a stud; and wherein each output terminal of the second plurality of output terminals uses a connection type other than a stud;

wherein the voltage of the first power supply is different than the voltage of the second power supply;

wherein the communication module is configured to alert a user if at least one predetermined fuse of one of the first plurality of fuses, or the second plurality of fuses is blown.

16. The vehicle power distribution module of claim 15, further comprising:

a panel having a top side and a bottom side and having a perimeter, the perimeter of the panel comprising a top edge, a bottom edge, a first edge and a second edge wherein the top edge is positioned opposite of the bottom edge and the first edge is positioned opposite of the second edge;

wherein the plurality of input terminals is positioned on the panel and proximate to the top edge;

wherein the first plurality of output terminals is positioned on the panel and proximate to the bottom edge; and wherein the second plurality of output terminals is positioned on the panel below the plurality of input terminals and above the first plurality of output terminals.

17. The vehicle power distribution module of claim 16, wherein a length of the top edge and a length of the bottom edge are each less than or equal to 11 inches (27.94 cm), and wherein a length of the first edge and a length of the second edge are each less than or equal to 8.5 inches (21.59 cm).

18. The vehicle power distribution module of claim 16, wherein a length of the top edge and a length of the bottom edge are each between 10 inches (25.4 cm) and 12 inches (30.48 cm), and wherein a length of the first edge and a length of the second edge are each between 7 inches (17.78 cm) and 9 inches (22.86 cm).

19. The vehicle power distribution module of claim 16, further comprising:

a first equalizer output terminal connected to the first input terminal and a second equalizer output terminal connected to the second input terminal and positioned on the panel and proximate to the top edge.

20. The vehicle power distribution module of claim 16, wherein the panel is constructed using press fit technology.

* * * * *